(12) United States Patent
Komiya

(10) Patent No.: US 12,396,360 B2
(45) Date of Patent: Aug. 19, 2025

(54) PHOTOELECTRIC CONVERSION ELEMENT MODULE AND METHOD OF PRODUCING SAME

(71) Applicant: ZEON CORPORATION, Tokyo (JP)

(72) Inventor: Ryoichi Komiya, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 486 days.

(21) Appl. No.: 17/906,192

(22) PCT Filed: Mar. 12, 2021

(86) PCT No.: PCT/JP2021/010200
§ 371 (c)(1),
(2) Date: Sep. 13, 2022

(87) PCT Pub. No.: WO2021/200048
PCT Pub. Date: Oct. 7, 2021

(65) Prior Publication Data
US 2023/0114517 A1 Apr. 13, 2023

(30) Foreign Application Priority Data
Mar. 31, 2020 (JP) .................. 2020-064572

(51) Int. Cl.
*H10K 85/20* (2023.01)
*H10K 30/15* (2023.01)
(Continued)

(52) U.S. Cl.
CPC .......... *H10K 85/221* (2023.02); *H10K 30/15* (2023.02); *H10K 30/40* (2023.02); *H10K 30/80* (2023.02);
(Continued)

(58) Field of Classification Search
None
See application file for complete search history.

(56) References Cited

U.S. PATENT DOCUMENTS

| 2012/0152340 A1 | 6/2012 | Kondo et al. |
| 2016/0196927 A1 | 7/2016 | Bryant et al. |
| 2018/0330891 A1 | 11/2018 | Wheeler et al. |

FOREIGN PATENT DOCUMENTS

| EP | 3496122 A1 | 6/2019 |
| JP | 2017152509 A | 8/2017 |

(Continued)

OTHER PUBLICATIONS

Sep. 29, 2022, International Preliminary Report on Patentability issued in the International Patent Application No. PCT/JP2021/010200.

(Continued)

*Primary Examiner* — Anthony Ho
(74) *Attorney, Agent, or Firm* — KENJA IP LAW PC

(57) ABSTRACT

A photoelectric conversion element module (1) includes a plurality of photoelectric conversion elements (15) formed on a light-transmitting base plate (3). The photoelectric conversion elements (15) each include a transparent conductive film (4), a first charge transport layer (5), a power-generating layer (6), and a second charge transport layer (7) stacked in order from a side corresponding to the light-transmitting base plate (3). The second charge transport layer (7) is formed of a porous film that contains a carbon material. Among two of the photoelectric conversion elements (15) that are adjacent to each other, the second charge transport layer (7) of one photoelectric conversion element and the transparent conductive film (4) of the other photoelectric conversion element are electrically connected via a first conductive adhesive layer (9), a current-collecting electrode (11), and a second conductive adhesive layer (14).

8 Claims, 1 Drawing Sheet

(51) Int. Cl.
  *H10K 30/40* (2023.01)
  *H10K 30/80* (2023.01)
  *H10K 30/85* (2023.01)
  *H10K 39/12* (2023.01)
  *H10K 85/50* (2023.01)
  *H10K 39/10* (2023.01)

(52) U.S. Cl.
  CPC ............. *H10K 30/85* (2023.02); *H10K 39/12* (2023.02); *H10K 85/50* (2023.02); *H10K 39/10* (2023.02)

(56) References Cited

FOREIGN PATENT DOCUMENTS

| | | |
|---|---|---|
| WO | 2011024534 A1 | 3/2011 |
| WO | 2018209104 A1 | 11/2018 |

OTHER PUBLICATIONS

Mar. 21, 2024, the Extended European Search Report issued by the European Patent Office in the corresponding European Patent Application No. 21780785.8.

Rahul Singh et al., Review of current progress in inorganic hole-transport materials for perovskite solar cells, Applied Materials Today, 2019, pp. 175-200, vol. 14.

May 18, 2021, International Search Report issued in the International Patent Application No. PCT/JP2021/010200.

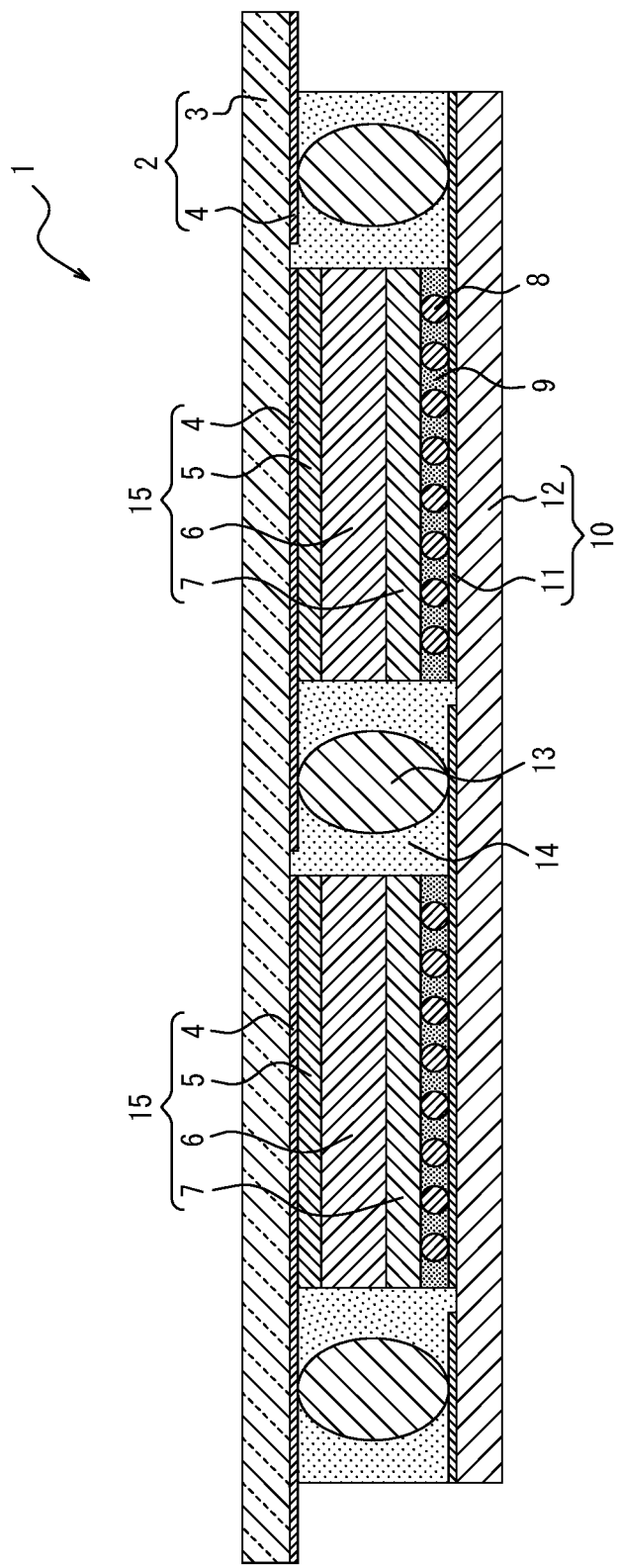

PHOTOELECTRIC CONVERSION ELEMENT MODULE AND METHOD OF PRODUCING SAME

TECHNICAL FIELD

The present disclosure relates to a photoelectric conversion element module and a method of producing the same.

BACKGROUND

Solar cells are of interest as photoelectric conversion elements that convert light energy to electrical power. There are various types of solar cells such as perovskite solar cells in which a perovskite compound is used as a power-generating layer, for example.

A photoelectric conversion element module in which a plurality of photoelectric conversion elements such as the solar cells described above are connected may be used from a viewpoint of increasing the electrical power that is obtained.

In a photoelectric conversion element module, it is necessary to prevent deterioration of characteristics and short-circuiting between electrodes, for example.

For example, Patent Literature (PTL) 1 reports that by adopting a configuration in which partitioning walls of adjacent solar cells are in opposition to each other across a gap in a solar cell module, deterioration of characteristics and short-circuiting between electrodes have a low tendency to occur.

CITATION LIST

Patent Literature

PTL 1: JP2017-152509A

SUMMARY

Technical Problem

However, although examples having high photoelectric conversion efficiency have been reported for photoelectric conversion element modules according to conventional techniques, there is still room for improvement in terms of durability.

Accordingly, an object of the present disclosure is to provide a photoelectric conversion element module having high photoelectric conversion efficiency and excellent durability.

Solution to Problem

The inventor conducted diligent investigation with the aim of solving the problem set forth above. The inventor discovered that high photoelectric conversion efficiency and excellent durability can be achieved in the case of a photoelectric conversion element module that includes a plurality of photoelectric conversion elements each including a transparent conductive film, a first charge transport layer, a power-generating layer, and a second charge transport layer formed of a carbon material-containing porous film stacked in this order on a light-transmitting base plate and in which, among two adjacent photoelectric conversion elements, the second charge transport layer of one photoelectric conversion element and the transparent conductive film of the other photoelectric conversion element are electrically connected via a first conductive adhesive layer, a current-collecting electrode, and a second conductive adhesive layer. In this manner, the inventor completed the present disclosure.

Specifically, the present disclosure aims to advantageously solve the problem set forth above, and a presently disclosed photoelectric conversion element module comprises a plurality of photoelectric conversion elements formed on a light-transmitting base plate, wherein the photoelectric conversion elements each include a transparent conductive film, a first charge transport layer, a power-generating layer, and a second charge transport layer stacked in order from a side corresponding to the light-transmitting base plate, the second charge transport layer is formed of a porous film that contains a carbon material, and, among two of the photoelectric conversion elements that are adjacent to each other, the second charge transport layer of one photoelectric conversion element and the transparent conductive film of the other photoelectric conversion element are electrically connected via a first conductive adhesive layer, a current-collecting electrode, and a second conductive adhesive layer. In the case of a photoelectric conversion element module that includes a plurality of photoelectric conversion elements each including a transparent conductive film, a first charge transport layer, a power-generating layer, and a second charge transport layer formed of a carbon material-containing porous film stacked in this order on a light-transmitting base plate and in which, among two adjacent photoelectric conversion elements, the second charge transport layer of one photoelectric conversion element and the transparent conductive film of the other photoelectric conversion element are electrically connected via a first conductive adhesive layer, a current-collecting electrode, and a second conductive adhesive layer in this manner, the photoelectric conversion element module has high photoelectric conversion efficiency and excellent durability.

The term "porous film" as used in the present disclosure refers to a film in which a plurality of pores are formed.

In the presently disclosed photoelectric conversion element module, the carbon material preferably includes one or more carbon nanotubes. When the carbon material includes carbon nanotubes, photoelectric conversion efficiency of the photoelectric conversion element module can be further increased.

Moreover, in the presently disclosed photoelectric conversion element module, the carbon nanotubes preferably include one or more single-walled carbon nanotubes. When the carbon nanotubes include single-walled carbon nanotubes, it is possible to impart excellent functionality as a hole transport layer to the second charge transport layer while also further increasing photoelectric conversion efficiency of the photoelectric conversion element module.

In the presently disclosed photoelectric conversion element module, it is preferable that the first conductive adhesive layer contains first conductive fine particles, and the first conductive fine particles contain either or both of a carbon material and a metal oxide. When the first conductive adhesive layer contains first conductive fine particles that contain either or both of a carbon material and a metal oxide, durability of the photoelectric conversion element module can be further increased.

In the presently disclosed photoelectric conversion element module, it is preferable that the first conductive adhesive layer contains first conductive fine particles, and the first conductive fine particles are at least partially embedded in the second charge transport layer. When the first conductive fine particles contained in the first conductive adhesive layer are at least partially embedded in the second charge transport layer, photoelectric conversion efficiency of the photoelectric conversion element module can be further increased.

In the presently disclosed photoelectric conversion element module, it is preferable that the first conductive adhesive layer contains first conductive fine particles, the second conductive adhesive layer contains second conductive fine particles, and the second conductive fine particles have a larger average particle diameter than the first conductive fine particles. When the average particle diameter of the second conductive fine particles contained in the second conductive adhesive layer is larger than the average particle diameter of the first conductive fine particles contained in the first conductive adhesive layer, photoelectric conversion efficiency of the photoelectric conversion element module can be further increased.

Note that the "average particle diameter" of fine particles referred to in the present disclosure can be determined by measuring the particle diameters of 100 randomly selected fine particles using an electron microscope and calculating an average value of the measured particle diameters.

In the presently disclosed photoelectric conversion element module, the power-generating layer preferably contains a perovskite compound. When the power-generating layer contains a perovskite compound, photoelectric conversion efficiency of the photoelectric conversion element module can be further increased.

Moreover, the present disclosure aims to advantageously solve the problem set forth above, and a presently disclosed method of producing a photoelectric conversion element module comprises a step of connecting two photoelectric conversion elements that are adjacent to each other among a plurality of photoelectric conversion elements formed on a light-transmitting base plate, wherein the photoelectric conversion elements each include a transparent conductive film, a first charge transport layer, a power-generating layer, and a second charge transport layer stacked in order from a side corresponding to the light-transmitting base plate, the second charge transport layer is formed of a porous film that contains a carbon material, and, among the two photoelectric conversion elements that are adjacent to each other, the second charge transport layer of one photoelectric conversion element and the transparent conductive film of the other photoelectric conversion element are electrically connected via a first conductive adhesive layer, a current-collecting electrode, and a second conductive adhesive layer. Through the presently disclosed method of producing a photoelectric conversion element module, it is possible to produce a photoelectric conversion element module having high photoelectric conversion efficiency and excellent durability.

Advantageous Effect

According to the present disclosure, it is possible to provide a photoelectric conversion element module having high photoelectric conversion efficiency and excellent durability.

BRIEF DESCRIPTION OF THE DRAWING

In the accompanying drawing,
FIG. 1 is a cross-sectional view schematically illustrating configuration of a photoelectric conversion element module according to one embodiment of the present disclosure.

DETAILED DESCRIPTION

The presently disclosed photoelectric conversion element module may, for example, be a solar cell module of organic thin-film solar cells, perovskite solar cells, or the like, but is not specifically limited thereto.

The following provides a detailed description of one embodiment of the presently disclosed photoelectric conversion element module with reference to FIG. 1.

(Photoelectric Conversion Element Module)

FIG. 1 is a cross-sectional view schematically illustrating configuration of a photoelectric conversion element module according to one embodiment of the present disclosure. The photoelectric conversion element module 1 includes a plurality of photoelectric conversion elements 15 on a light-transmitting base plate 3. As illustrated in FIG. 1, the photoelectric conversion element module 1 includes two photoelectric conversion elements 15 that are adjacent to each other on the light-transmitting base plate 3.

The photoelectric conversion elements 15 each include a transparent conductive film 4, a first charge transport layer 5, a power-generating layer 6, and a second charge transport layer 7 stacked in order from a side corresponding to the light-transmitting base plate 3. The second charge transport layer 7 is formed of a porous film that contains a carbon material. In addition, a first conductive adhesive layer 9 is formed at a surface at an opposite side of the second charge transport layer 7 to the side at which the power-generating layer 6 is formed. Moreover, a surface at the opposite side of the first conductive adhesive layer 9 to the side at which the second charge transport layer 7 is formed is connected to a current-collecting electrode 11. Accordingly, the second charge transport layer 7 of the photoelectric conversion element 15 and the current-collecting electrode 11 are electrically connected via the first conductive adhesive layer 9. Note that the current-collecting electrode 11 is formed on a base plate 12. In the present specification, a member having the current-collecting electrode 11 formed on the base plate 12 is also referred to as a "current-collecting electrode base plate 10".

Among the two adjacent photoelectric conversion elements 15, the second charge transport layer 7 of one photoelectric conversion element 15 (left side in FIG. 1) and the transparent conductive film 4 of the other photoelectric conversion element 15 (right side in FIG. 1) are electrically connected via a first conductive adhesive layer 9, a current-collecting electrode 11, and a second conductive adhesive layer 14.

In FIG. 1, one current-collecting electrode 11 (left side in FIG. 1) and the second charge transport layer 7 of the one photoelectric conversion element 15 are electrically connected via a first conductive adhesive layer 9 as previously described. The one current-collecting electrode 11 extends to a side corresponding to the other photoelectric conversion element 15 (right side in FIG. 1). Moreover, the transparent conductive film 4 of the other photoelectric conversion element 15 extends to a side corresponding to the one photoelectric conversion element 15. A second conductive adhesive layer 14 is formed between a section of the one current-collecting electrode 11 that extends to the side corresponding to the other photoelectric conversion element 15 and a section of the transparent conductive film 4 of the other photoelectric conversion element 15 that extends to the side corresponding to the one photoelectric conversion element 15. Accordingly, the one current-collecting electrode 11 and the transparent conductive film 4 of the other photoelectric conversion element 15 are electrically connected via the second conductive adhesive layer 14. In this manner, among the two adjacent photoelectric conversion elements 15 on the light-transmitting base plate 3, the second charge transport layer 7 of one photoelectric conversion element 15 and the transparent conductive film 4 of the other photoelectric conversion element 15 are electrically connected via a first conductive adhesive layer 9, a current-collecting electrode 11, and a second conductive adhesive layer 14.

Note that the first conductive adhesive layer 9 contains first conductive fine particles 8. In FIG. 1, the first conductive fine particles 8 are in contact with both the second charge transport layer 7 and the current-collecting electrode 11. However, it should be noted that in the photoelectric conversion element module 1, a first conductive fine particle 8 that is only in contact with one of the second charge transport layer 7 and the current-collecting electrode 11 may be present, and a first conductive fine particle 8 that is not in contact with either of the second charge transport layer 7 and the current-collecting electrode 11 may be present to the extent that the desired effects are obtained.

The second conductive adhesive layer 14 contains second conductive fine particles 13. In FIG. 1, a second conductive fine particle 13 is in contact with both the one current-collecting electrode 11 and the transparent conductive film 4 of the other photoelectric conversion element 15. However, it should be noted that in the photoelectric conversion element module 1, a second conductive fine particle 13 that is only in contact with one of the one current-collecting electrode 11 and the transparent conductive film 4 of the other photoelectric conversion element 15 may be present, and a second conductive fine particle 13 that is not in contact with either of the one current-collecting electrode 11 and the transparent conductive film 4 of the other photoelectric conversion element 15 may be present to the extent that the desired effects are obtained. Moreover, an electrical conduction path may be formed from the one current-collecting electrode 11 to the transparent conductive film 4 of the other photoelectric conversion element 15 through a plurality of second conductive fine particles 13 being arranged in a row such that a second conductive fine particle 13 that is arranged at one end is in contact with the one current-collecting electrode 11 and a second conductive fine particle 13 that is arranged at the other end is in contact with the transparent conductive film 4 of the other photoelectric conversion element 15.

Note that in FIG. 1, the transparent conductive film 4 of the one photoelectric conversion element 15 and the transparent conductive film 4 of the other photoelectric conversion element 15 are not in contact.

Also note that the one current-collecting electrode 11 and the other current-collecting electrode 11 are not in contact in FIG. 1.

Although partially omitted in FIG. 1, the transparent conductive film 4 of the one photoelectric conversion element 15 (left side in FIG. 1) may be electrically connected to the second charge transport layer 7 of another photoelectric conversion element 15 via a second conductive adhesive layer 14, a current-collecting electrode 11, and a first conductive adhesive layer 9. Likewise, the second charge transport layer 7 of the other photoelectric conversion element 15 (right side in FIG. 1) may be electrically connected to the transparent conductive film 4 of another photoelectric conversion element 15 via a first conductive adhesive layer 9, a current-collecting electrode 11, and a second conductive adhesive layer 14.

For any two adjacent photoelectric conversion elements 15 among the plurality of photoelectric conversion elements 15 in the photoelectric conversion element module 1, the second charge transport layer 7 of one photoelectric conversion element 15 and the transparent conductive film 4 of the other photoelectric conversion element 15 should be electrically connected via a first conductive adhesive layer 9, a current-collecting electrode 11, and a second conductive adhesive layer 14. For example, in a case in which the photoelectric conversion element module 1 includes three or more photoelectric conversion elements 15, at least any two photoelectric conversion elements 15 among the three or more photoelectric conversion elements 15 are electrically connected by the specific method set forth above, but it is preferable that all electrical connections between the photoelectric conversion elements 15 in the photoelectric conversion element module 1 are by the specific method set forth above from a viewpoint of further increasing photoelectric conversion efficiency.

The following describes, in order, each of the constituent members forming the photoelectric conversion element module 1.

<Light-Transmitting Base Plate 3>

The light-transmitting base plate 3 constitutes a substrate of the photoelectric conversion element module 1. The light-transmitting base plate 3 may be a base plate formed of glass or a synthetic resin, a film formed of a synthetic resin, or the like, for example, without any specific limitations.

Examples of glass that may form the light-transmitting base plate 3 include glass made of an inorganic substance such as soda glass.

Examples of synthetic resins that may form the light-transmitting base plate 3 include polyacrylic resin, polycarbonate resin, polyester resin, polyimide resin, polystyrene resin, polyvinyl chloride resin, polyamide resin, and polycycloolefin resin. Of these examples, polyethylene terephthalate (PET) and polyethylene naphthalate (PEN) are preferable as synthetic resins from a viewpoint of obtaining a photoelectric conversion element module 1 that is thin, light, and flexible.

The thickness of the light-transmitting base plate 3 is not specifically limited and may be any thickness that makes it possible to maintain the shape thereof as a base plate. For example, the thickness of the light-transmitting base plate 3 can be set as not less than 0.1 mm and not more than 10 mm.

<Photoelectric Conversion Elements 15>

The photoelectric conversion element module 1 includes a plurality of photoelectric conversion elements 15 formed on the light-transmitting base plate 3. The photoelectric conversion elements 15 each include a transparent conductive film 4, a first charge transport layer 5, a power-generating layer 6, and a second charge transport layer 7 stacked in order from a side corresponding to the light-transmitting base plate 3.

<<Transparent Conductive Film 4>>

The transparent conductive film 4 is a film formed of a metal oxide that is formed on the surface of the light-transmitting base plate 3. By providing the transparent conductive film 4, it is possible to impart electrical conductivity to the surface of the light-transmitting base plate 3. Note that in the present specification, a member having the transparent conductive film 4 formed on the surface of the light-transmitting base plate 3 may also be referred to as a "transparent conductive base plate 2".

The metal oxide forming the transparent conductive film 4 may be fluorine-doped tin oxide (FTO), tin oxide (SnO), indium oxide ($In_2O_3$), tin-doped indium oxide (ITO), zinc oxide (ZnO), indium oxide/zinc oxide (IZO), gallium oxide/zinc oxide (GZO), or the like, for example. Note that the transparent conductive films of the plurality of photoelectric conversion elements 15 in the photoelectric conversion element module 1 illustrated in FIG. 1 may each be formed of the same metal oxide or may be formed of different metal oxides to one another.

The thickness of the transparent conductive film 4 is not specifically limited so long as it is a thickness that can impart the desired electrical conductivity to the light-transmitting base plate 3 and can, for example, be set as not less than 1 nm and not more than 1 μm.

<<First Charge Transport Layer 5>>

The first charge transport layer 5 may be a layer formed of a p-type semiconductor (hole transport layer) or a layer formed of an n-type semiconductor (electron transport layer). However, it is necessary for one of the first charge transport layer 5 and the second charge transport layer 7 to be formed of a p-type semiconductor and the other of the first charge transport layer 5 and the second charge transport layer 7 to be formed of an n-type semiconductor. For example, in a case in which the second charge transport layer 7 is formed of a p-type semiconductor, the first charge transport layer 5 is formed of an n-type semiconductor. Since the second charge transport layer 7 is formed of a porous film containing a carbon material in the present disclosure, the first charge transport layer 5 preferably has light transmittivity regardless of whether it is formed of a p-type semiconductor or an n-type semiconductor.

In a case in which the first charge transport layer 5 is an electron transport layer formed of an n-type semiconductor, for example, the structure of the first charge transport layer 5 is not specifically limited and may be one layer that is formed of an n-type semiconductor or may be two layers including a base layer and a porous semiconductor layer. The following provides a detailed description of the base layer and the porous semiconductor layer for a case in which the first charge transport layer 5 is formed of these two layers.

<Base Layer>

The base layer is an optionally provided layer. Through provision of the base layer, direct contact of the light-transmitting base plate 3 or the transparent conductive film 4 with the subsequently described porous semiconductor layer is prevented. This prevents loss of electromotive force and thereby further increases photoelectric conversion efficiency of the photoelectric conversion element module 1.

The base layer may be a porous film or may be a non-porous dense film, for example, so long as it is formed of an n-type semiconductor. However, the base layer is preferably a non-porous dense film from a viewpoint of sufficiently preventing contact of the light-transmitting base plate 3 or the transparent conductive film 4 with the porous semiconductor layer. The thickness of the base layer is not specifically limited and can, for example, be set as not less than 1 nm and not more than 500 nm. The base layer may optionally contain an electrically insulating material other than the n-type semiconductor in a proportion that does not cause the loss of character of the base layer as an n-type semiconductor.

<Porous Semiconductor Layer>

The porous semiconductor layer is a layer having a porous form. The inclusion of the porous semiconductor layer in the first charge transport layer 5 can further increase photoelectric conversion efficiency of the photoelectric conversion element module 1.

The porous semiconductor layer preferably contains a metal oxide and/or an organic compound, more preferably contains fine particles formed of a metal oxide and/or an organic compound, and is even more preferably formed from fine particles formed of a metal oxide and/or an organic compound.

The metal oxide that may form the porous semiconductor layer is not specifically limited so long as it is a metal oxide that functions as an n-type semiconductor and may be titanium oxide ($TiO_2$), for example.

The organic compound that may form the porous semiconductor layer may be a fullerene derivative such as phenyl C61 butyric acid methyl ester (PCBM), for example.

The average particle diameter of fine particles of a metal oxide and/or an organic compound that may be used in the porous semiconductor layer is preferably not less than 2 nm and not more than 80 nm, and more preferably 30 nm or less. A smaller average particle diameter for the fine particles can reduce the resistance of the porous semiconductor layer.

The thickness of the porous semiconductor layer is not specifically limited but is normally 5 nm or more, and preferably 10 nm or more, and is normally 500 nm or less, and preferably 150 nm or less.

<<Power-Generating Layer 6>>

The power-generating layer 6 is a layer that is formed of a material that generates electromotive force through absorption of light, is preferably a layer that contains a perovskite compound from a viewpoint of further increasing photoelectric conversion efficiency of the photoelectric conversion element module 1, and is more preferably a layer (perovskite layer) that is formed of a perovskite compound.

Examples of perovskite compounds that may form the power-generating layer 6 include commonly known perovskite compounds without any specific limitations. More specifically, the perovskite compound may be $CH_3NH_3PbI_3$, $CH_3NH_3PbBr_3$, $(CH_3(CH_2)_n CHCH_3NH_3)_2PbI_4$ [n=5 to 8], $(C_6H_5C_2H_4NH_3)_2PbBr_4$, or the like, for example.

The thickness of the power-generating layer 6 is not specifically limited but is preferably 100 nm or more, and more preferably 200 nm or more, and is preferably 1 μm or less, and more preferably 800 nm or less. By setting the thickness of the power-generating layer 6 as 100 nm or more, electromotive force of the power-generating layer 6 can be increased.

<Joining Layer>

Although not illustrated in FIG. 1, the photoelectric conversion element 15 may include a joining layer in at least part of between the power-generating layer 6 and the second charge transport layer 7. The joining layer is formed of an organic material A and has a different composition and property to the power-generating layer 6 and the second charge transport layer 7. Voids can be formed between the power-generating layer 6 and the second charge transport layer 7 due to irregularities at the surface of the power-generating layer 6 and due to the porous film forming the second charge transport layer 7. The inclusion of the joining layer between the power-generating layer 6 and the second charge transport layer 7 can fill in these voids. The inclusion of the joining layer in the photoelectric conversion element 15 enables good transfer of charge between the power-generating layer 6 and the second charge transport layer 7, and can thereby further increase photoelectric conversion efficiency of the photoelectric conversion element module 1.

The organic material A forming the joining layer may be a polymer material that displays adhesiveness such as polymethyl methacrylate (PMMA), a polymer material that displays semiconductor properties such as 2,2',7,7'-tetrakis (N,N-di-p-methoxyphenylamino)-9,9'-spirobifluorene (spiro-MeOTAD), or the like, for example. Moreover, the joining layer may be formed using a mixture of any of these various materials.

The thickness of the joining layer can be set as appropriate depending on the surface shape of the power-generating layer 6 and/or the second charge transport layer 7, for example, without any specific limitations, so long as it fills in voids that are formed between the power-generating layer 6 and the second charge transport layer 7.

<<Second Charge Transport Layer 7>>

The second charge transport layer 7 may be a layer that is formed of a p-type semiconductor (hole transport layer) or a layer that is formed of an n-type semiconductor (electron transport layer), but it is necessary for one of the first charge transport layer 5 and the second charge transport layer 7 to be formed of a p-type semiconductor and the other of the first charge transport layer 5 and the second charge transport layer 7 to be formed of an n-type semiconductor. For example, in a case in which the previously described first charge transport layer 5 is formed of an n-type semiconductor, it is necessary for the second charge transport layer 7 to be formed of a p-type semiconductor.

{Porous Film Containing Carbon Material}

The second charge transport layer 7 is formed of a porous film that contains a carbon material. The method by which the porous film containing the carbon material is formed may be a method that enables formation of the porous film at a specific position. For example, the porous film can be formed by a method of affixing a self-supporting film or an application method such as printing. However, from a viewpoint of obtaining a preferable thickness and inhibiting short-circuiting, it is preferable that the porous film containing the carbon material is a film that it is self-supporting and that is formed through affixing of this self-supporting film.

In a case in which a metal material is used as the second charge transport layer 7, for example, the metal material contained in the second charge transport layer 7 and a component included in a perovskite compound contained in the power-generating layer 6, such as iodide ions, can react and cause corrosion, thereby reducing durability of the photoelectric conversion element module 1. Moreover, in a case in which an organic semiconductor material is used as the second charge transport layer 7, for example, durability of the photoelectric conversion element module 1 decreases due to the organic semiconductor material having insufficient stability. In contrast, a carbon material does not cause corrosion through reaction with a perovskite compound as described above and also has excellent stability, and thus durability of the photoelectric conversion element module 1 can be increased by using a film that contains a carbon material as the second charge transport layer 7.

Moreover, by using a porous film as the second charge transport layer 7, it is possible to stabilize electrical connection between photoelectric conversion elements 15 and to improve photoelectric conversion efficiency of the photoelectric conversion element module 1. The reason that it is possible to stabilize electrical connection between photoelectric conversion elements 15 and to improve photoelectric conversion efficiency of the photoelectric conversion element module 1 by using a porous film as the second charge transport layer 7 is as follows.

Firstly, there may be variation in the thickness of each layer (second charge transport layer 7, etc.) forming the photoelectric conversion element 15. There may also be variation in the particle diameter of first conductive fine particles 8 contained in the first conductive adhesive layer 9.

In a case in which a film that is not porous is used as the second charge transport layer 7, it is not possible to absorb variation in each layer and in the particle diameter of the conductive fine particles 8 described above when the light-transmitting base plate 3 having the plurality of photoelectric conversion elements 15, etc., formed thereon and the current-collecting electrode base plate 10 are affixed in order to produce the photoelectric conversion element module 1 because the film that is not porous has insufficient flexibility. Consequently, it may be the case that a portion of the first conductive fine particles 8 cannot be in contact with the second charge transport layer 7 and/or the current-collecting electrode 11. In this case, internal resistance increases and photoelectric conversion efficiency of the photoelectric conversion element module 1 decreases due to insufficient electrical connection between the photoelectric conversion elements 15.

In contrast, in a case in which a porous film is used as the second charge transport layer 7, variation in each layer and variation in the particle diameter of the conductive fine particles 8 described above can be absorbed through deformation and a suitable degree of squashing of the porous film when the light-transmitting base plate 3 having the plurality of photoelectric conversion elements 15, etc., formed thereon and the current-collecting electrode base plate 10 are affixed in order to produce the photoelectric conversion element module 1 because the porous film has excellent flexibility. This can ensure good contact of the first conductive fine particles 8 with the second charge transport layer 7 and the current-collecting electrode 11. Consequently, photoelectric conversion efficiency of the photoelectric conversion element module 1 can be improved because electrical connection between the photoelectric conversion elements 15 can be stabilized.

For the reason set forth above, a photoelectric conversion element module having high photoelectric conversion efficiency and excellent durability can be obtained in a case in which a porous film containing a carbon material is used as the second charge transport layer 7.

Moreover, in a case in which a porous film is used as the second charge transport layer 7, a pre-curing first conductive adhesive layer adjacent to the porous film (second charge transport layer 7) infiltrates into the porous film when the light-transmitting base plate 3 having the plurality of photoelectric conversion elements 15, etc., formed thereon and the current-collecting electrode base plate 10 are affixed in order to produce the photoelectric conversion element module 1. This makes it possible to prevent short-circuiting by inhibiting the pre-curing first conductive adhesive layer from spreading out under pressing and reaching another photoelectric conversion element.

From a viewpoint of imparting excellent flexibility to the porous film and thereby further stabilizing electrical connection and further increasing photoelectric conversion efficiency of the photoelectric conversion element module 1, it is preferable to use a fibrous carbon material as the carbon material contained in the porous film, more preferable to use fibrous carbon nanostructures, even more preferable to use carbon nanotubes (hereinafter, also abbreviated as "CNTs"), and particularly preferable to use single-walled carbon nanotubes. Particularly in a case in which a porous film that contains single-walled CNTs displaying semiconductor properties as a carbon material is used, it is possible to impart excellent functionality as a hole transport layer to the second charge transport layer 7.

—Single-Walled CNTs—

Single-walled CNTs that can be contained in the porous film preferably have the following properties.

——(3σ/Av)——

A ratio (3σ/Av) of a value (3σ) (diameter standard deviation (σ) multiplied by 3) relative to the average diameter (Av) of the single-walled CNTs contained in the porous film is preferably more than 0.20, more preferably more than 0.25, and even more preferably more then 0.50, and is preferably less than 0.60. When 3σ/Av is more than 0.20 and less than 0.60, it is possible to impart sufficient functionality as a hole transport layer to the second charge transport layer 7 even when the porous film only contains a small amount of the single-walled CNTs.

——Average Diameter (Av) of Single-Walled CNTs——

The average diameter (Av) of the single-walled CNTs is preferably 0.5 nm or more, and more preferably 1 nm or more, and is preferably 15 nm or less, and more preferably 10 nm or less. When the average diameter (Av) of the single-walled CNTs is 0.5 nm or more, aggregation of the single-walled CNTs can be inhibited, and dispersibility of the single-walled CNTs in the second charge transport layer 7 can be increased.

Note that the average diameter (Av) of single-walled CNTs and the ratio (3σ/Av) of the value (3σ) (diameter standard deviation (σ) multiplied by 3) relative to the average diameter (Av) can be determined by measuring the diameters and lengths of 100 randomly selected single-walled CNTs using a scanning electron microscope or a transmission electron microscope.

——t-Plot——

The single-walled CNTs preferably exhibit a convex upward shape in a t-plot obtained from an adsorption isotherm. These single-walled CNTs are more preferably CNTs that have not undergone opening formation treatment. By using single-walled CNTs that exhibit a convex upward shape in a t-plot obtained from an adsorption isotherm, it is possible to obtain a second charge transport layer 7 having excellent strength.

A bending point of the t-plot for the single-walled CNTs is preferably within a range of $0.2 \leq t$ (nm)$\leq 1.5$, more preferably within a range of $0.45 \leq t$ (nm)$\leq 1.5$, and even more preferably within a range of $0.55 \leq t$ (nm)$\leq 1.0$.

Measurement of an adsorption isotherm for single-walled CNTs, preparation of a t-plot, and analysis of the t-plot can be performed using a BELSORP®-mini (BELSORP is a registered trademark in Japan, other countries, or both), for example, which is a commercially available measurement apparatus produced by Bel Japan Inc.

The single-walled CNTs preferably have a radial breathing mode (RBM) peak upon evaluation by Raman spectroscopy. Note that an RBM is not present in the Raman spectrum of fibrous carbon nanostructures composed of only multi-walled carbon nanotubes having three or more walls.

A ratio (G/D ratio) of G band peak intensity relative to D band peak intensity in a Raman spectrum for the single-walled CNTs is preferably not less than 0.5 and not more than 5.0.

Single-walled CNTs having the properties set forth above can be efficiently produced by, in a method in which during synthesis of CNTs through chemical vapor deposition (CVD) by supplying a feedstock compound and a carrier gas onto a substrate having a catalyst layer for CNT production at the surface thereof, a trace amount of an oxidant (catalyst activating material) is provided in the system so as to dramatically improve the catalytic activity of the catalyst layer (super growth method; refer to WO2006/011655A1), forming the catalyst layer on the substrate surface by a wet process.

In particular, single-walled CNTs obtained by the super growth method (also referred to as "SGCNTs") are preferably used as the single-walled CNTs from a viewpoint of easily obtaining a porous film having a large thickness.

—Proportional Content of Carbon Material—

The porous film should contain a carbon material such as the single-walled CNTs described above and is preferably formed of the carbon material.

The proportional content of the carbon material such as single-walled CNTs in the porous film is not specifically limited but is preferably 50 mass % or more, more preferably 75 mass % or more, and even more preferably 90 mass % or more.

—Other Components—

The porous film may further contain components other than the carbon material to the extent that the desired effects are obtained. For example, metal oxide fine particles that are not corrosive with respect to constituent materials may be used to support electrical conductivity.

—Thickness—

The thickness of the porous film in a state in which it is not pressed in a thickness direction is preferably 10 μm or more, more preferably 15 μm or more, and even more preferably 20 μm or more, and is preferably 200 μm or less, more preferably 150 μm or less, and even more preferably 80 μm or less. When the thickness of the porous film in a state in which it is not pressed in the thickness direction is not less than any of the lower limits set forth above, photoelectric conversion efficiency of the photoelectric conversion element module 1 can be further improved because electrical connection between the photoelectric conversion elements 15 can be further stabilized through good absorption of variation in each layer and variation in the particle diameter of the conductive fine particles 8 described above. On the other hand, when the thickness of the porous film in a state in which it is not pressed in the thickness direction is not more than any of the upper limits set forth above, this is preferable because formation of the second charge transport layer 7 that is formed of the porous film becomes easier. Note that when the thickness of the porous film in a state in which it is not being pressed in the thickness direction is not less than any of the upper limits set forth above, this is not preferable because processes such as formation, processing, and installation become complicated and difficult.

Note that the thickness of a porous film can be measured by a method described in the EXAMPLES section of the present specification.

The thickness of the porous film decreases when the porous film is pressed in the thickness direction because the porous film is flexible as previously described.

For example, the thickness reduction in a situation in which the porous film is pressed at 0.05 Pa in the thickness direction is preferably 1 μm or more, and more preferably 2 μm or more, and is preferably not more than half of the thickness of the porous film prior to pressing in the thickness direction. When the thickness reduction in a situation in which the porous film is pressed at 0.05 Pa is not less than any of the lower limits set forth above, electrical connection between the photoelectric conversion elements 15 can be further stabilized and photoelectric conversion efficiency of the photoelectric conversion element module 1 can be further improved through good absorption of variation in each layer and variation in the particle diameter of the conductive fine particles 8 described above because the porous film has excellent flexibility. On the other hand, when the thickness reduction in a situation in which the porous film is pressed at 0.05 Pa is not more than the upper limit set forth above, self-supporting ability of the porous film can be maintained well.

Note that the thickness reduction in a situation in which a porous film is pressed at 0.05 Pa can be measured by a method described in the EXAMPLES section of the present specification.

—Density—

The density of the porous film in a state in which it is not pressed in the thickness direction is preferably 0.4 g/cm$^3$ or more, and preferably 0.6 g/cm$^3$ or more, and is preferably 1.5 g/cm$^3$ or less, and preferably 1.2 g/cm$^3$ or less. When the density of the porous film is not less than any of the lower limits set forth above, self-supporting ability of the porous film can be maintained well. On the other hand, when the density of the porous film is not more than any of the upper limits set forth above, electrical connection between the photoelectric conversion elements 15 can be further stabilized and photoelectric conversion efficiency of the photoelectric conversion element module 1 can be further improved through good absorption of variation in each layer and variation in the particle diameter of the conductive fine particles 8 described above because the porous film has excellent flexibility.

Note that the density of a porous film can be measured by a method described in the EXAMPLES section of the present specification.

—Production Method of Porous Film Containing Carbon Material—

No specific limitations are placed on the method by which the porous film containing the carbon material is produced. For example, a method including a step (film formation step) of removing solvent from a fibrous carbon nanostructure dispersion liquid that contains fibrous carbon nanostructures including single-walled CNTs as a carbon material, a dispersant, and a solvent so as to form a porous film can be adopted. The production method of the porous film containing the carbon material may, prior to the film formation step, optionally include a step (dispersion liquid production step) of performing dispersing treatment of a crude dispersion liquid containing fibrous carbon nanostructures including single-walled CNTs, a dispersant, and a solvent so as to produce the fibrous carbon nanostructure dispersion liquid.

——Dispersion Liquid Production Step——

In the dispersion liquid production step, a crude dispersion liquid containing fibrous carbon nanostructures that include single-walled CNTs, a dispersant, and a solvent is preferably subjected to dispersing treatment that brings about a cavitation effect or a crushing effect such as described in detail further below so as to disperse the fibrous carbon nanostructures including single-walled CNTs and produce a fibrous carbon nanostructure dispersion liquid, but is not specifically limited to being treated in this manner. By performing dispersing treatment that brings about a cavitation effect or a crushing effect in this manner, it is possible to obtain a fibrous carbon nanostructure dispersion liquid in which the fibrous carbon nanostructures including single-walled CNTs are dispersed well. Moreover, by producing the porous film using fibrous carbon nanostructures having single-walled CNTs dispersed well, it is possible to cause uniform dispersion of the single-walled CNTs and obtain a porous film having excellent characteristics such as electrical conductivity, thermal conductivity, and mechanical characteristics. Note that the fibrous carbon nanostructure dispersion liquid used to produce the porous film may be produced by using commonly known dispersing treatment other than that described above to disperse fibrous carbon nanostructures including single-walled CNTs in a solvent.

The fibrous carbon nanostructures used to produce the fibrous carbon nanostructure dispersion liquid include at least single-walled CNTs and may, for example, be a mixture of single-walled CNTs and fibrous carbon nanostructures other than single-walled CNTs (for example, multi-walled CNTs, etc.).

The proportional contents of single-walled CNTs and fibrous carbon nanostructures other than single-walled CNTs in the fibrous carbon nanostructure dispersion liquid can be set as a mass ratio (single-walled CNTs/fibrous carbon nanostructures other than single-walled CNTs) of 50/50 to 75/25, for example.

=Dispersant=

The dispersant used in production of the fibrous carbon nanostructure dispersion liquid is not specifically limited so long as it can disperse fibrous carbon nanostructures that at least include single-walled CNTs and can dissolve in the solvent that is used to produce the fibrous carbon nanostructure dispersion liquid. Examples of such dispersants include surfactants, synthetic polymers, and natural polymers.

Examples of surfactants that can be used include sodium dodecylsulfonate, sodium deoxycholate, sodium cholate, and sodium dodecylbenzenesulfonate.

Examples of synthetic polymers that can be used include polyether diols, polyester diols, polycarbonate diols, polyvinyl alcohol, partially saponified polyvinyl alcohol, acetoacetyl group-modified polyvinyl alcohol, acetal group-modified polyvinyl alcohol, butyral group-modified polyvinyl alcohol, silanol group-modified polyvinyl alcohol, ethylene-vinyl alcohol copolymers, ethylene-vinyl alcohol-vinyl acetate copolymer resins, dimethylaminoethyl acrylate, dimethylaminoethyl methacrylate, acrylic resins, epoxy resins, modified epoxy resins, phenoxy resins, modified phenoxy resins, phenoxy ether resins, phenoxy ester resins, fluororesins, melamine resins, alkyd resins, phenolic resins, polyacrylamide, polyacrylic acid, polystyrene sulfonic acid, polyethylene glycol, and polyvinyl pyrrolidone.

Examples of natural polymers that can be used include polysaccharides such as starch, pullulan, dextran, dextrin, guar gum, xanthan gum, amylose, amylopectin, alginic acid, gum Arabic, carrageenan, chondroitin sulfate, hyaluronic acid, curdlan, chitin, chitosan, cellulose, and salts and derivatives thereof. The term derivatives refers to conventionally known compounds such as esters and ethers.

One of these dispersants may be used individually, or two or more of these dispersants may be used as a mixture. Of these examples, surfactants are preferable as the dispersant due to exhibiting excellent dispersing ability toward fibrous carbon nanostructures including single-walled CNTs, and sodium deoxycholate or the like is more preferable as the dispersant.

=Solvent=

Examples of the solvent of the fibrous carbon nanostructure dispersion liquid include, but are not specifically limited to, water, alcohols such as methanol, ethanol, n-propanol, isopropanol, n-butanol, isobutanol, t-butanol, pentanol, hexanol, heptanol, octanol, nonanol, decanol, and amyl alcohol, ketones such as acetone, methyl ethyl ketone, and cyclohexanone, esters such as ethyl acetate and butyl acetate, ethers such as diethyl ether, dioxane, and tetrahydrofuran, amide polar organic solvents such as N,N-dimethylformamide and N-methylpyrrolidone, and aromatic hydrocarbons such as toluene, xylene, chlorobenzene, orthodichlorobenzene, and paradichlorobenzene. One of these solvents may be used individually, or two or more of these solvents may be used as a mixture.

In the dispersion liquid production step, it is preferable that dispersing treatment that brings about a cavitation effect or a crushing effect such as described below is performed, for example.

=Dispersing Treatment Bringing about Cavitation Effect=

The dispersing treatment that brings about a cavitation effect is a dispersing method that utilizes shock waves caused by the rupture of vacuum bubbles formed in water when high energy is imparted to the liquid. This dispersing method enables good dispersion of single-walled CNTs.

Specific examples of dispersing treatments that bring about a cavitation effect include dispersing treatment using ultrasound, dispersing treatment using a jet mill, and dispersing treatment using high-shear stirring. Just one of these dispersing treatments may be carried out, or a plurality of these dispersing treatments may be carried out in combination. More specifically, the use of an ultrasonic homogenizer, a jet mill, or a high-shear stirring device is preferable, for example. Commonly known conventional devices may be used as these devices.

In a situation in which the single-walled CNTs are dispersed using an ultrasonic homogenizer, the crude dispersion liquid is irradiated with ultrasound by the ultrasonic homogenizer. The irradiation time may be set as appropriate depending on the amount of the single-walled CNTs and so forth. For example, the irradiation time is preferably 3 minutes or more, and more preferably 30 minutes or more, and is preferably 5 hours or less, and more preferably 2 hours or less. Moreover, the power is preferably not less than 20 W and not more than 500 W, and more preferably not less than 100 W and not more than 500 W, for example, and the temperature is preferably not lower than 15° C. and not higher than 50° C., for example.

In a situation in which a jet mill is used, the number of treatment repetitions carried out may be set as appropriate depending on the amount of the single-walled CNTs and so forth. For example, the number of repetitions is preferably 2 or more, and more preferably 5 or more, and is preferably 100 or less, and more preferably 50 or less. Moreover, the pressure is preferably not less than 20 MPa and not more than 250 MPa, for example, and the temperature is preferably not lower than 15° C. and not higher than 50° C., for example.

In a situation in which high-shear stirring is used, the crude dispersion liquid is subjected to stirring and shearing using a high-shear stirring device. The rotational speed is preferably as fast as possible. The operating time (i.e., the time during which the device is rotating) is preferably not less than 3 minutes and not more than 4 hours, for example, the circumferential speed is preferably not less than 5 m/s and not more than 50 m/s, for example, and the temperature is preferably not lower than 15° C. and not higher than 50° C., for example.

The dispersing treatment that brings about a cavitation effect is more preferably performed at a temperature of 50° C. or lower. This suppresses change in concentration due to solvent volatilization.

=Dispersing Treatment Bringing about Crushing Effect=

Dispersing treatment that brings about a crushing effect is even more beneficial because, in addition to of course enabling uniform dispersion of the single-walled CNTs in the solvent, dispersing treatment that brings about a crushing effect can suppress damage to the single-walled CNTs due to shock waves when bubbles burst compared to dispersing treatment that brings about a cavitation effect described above.

In the dispersing treatment that brings about a crushing effect, shear force is imparted to the crude dispersion liquid so as to crush and disperse aggregates of the fibrous carbon nanostructures including the single-walled CNTs, back pressure is further applied to the crude dispersion liquid, and cooling of the crude dispersion liquid is performed as necessary in order to enable uniform dispersion of the single-walled CNTs in the solvent while also suppressing bubble formation.

In a case in which back pressure is applied to the crude dispersion liquid, the back pressure applied to the crude dispersion liquid may be lowered at once to atmospheric pressure, but is preferably lowered over multiple steps.

——Film Formation Step——

In the film formation step, the solvent is removed from the fibrous carbon nanostructure dispersion liquid described above so as to form a porous film. Specifically, in the film formation step, the solvent may be removed from the fibrous carbon nanostructure dispersion liquid to form a porous film using either of the following methods (A) or (B), for example.

(A) A method in which the fibrous carbon nanostructure dispersion liquid is applied onto a film formation substrate and subsequently dried (B) A method in which the fibrous carbon nanostructure dispersion liquid is filtered using a film formation substrate that is porous and the resultant filtration residue is dried =Film Formation Substrate=

A known substrate can be used as the film formation substrate without any specific limitations.

Specifically, the film formation substrate onto which the fibrous carbon nanostructure dispersion liquid is applied in method (A) may be a resin substrate, a glass substrate, or the like. Examples of resin substrates that can be used include substrates made from polyethylene terephthalate (PET), polyethylene naphthalate (PEN), polytetrafluoroethylene (PTFE), polyimides, polyphenylene sulfide, aramids, polypropylene, polyethylene, polylactic acid, polyvinyl chloride, polycarbonates, polymethyl methacrylate, alicyclic acrylic resins, cycloolefin resins, and triacetyl cellulose. Examples of glass substrates that can be used include a substrate made from normal soda glass.

The film formation substrate through which the fibrous carbon nanostructure dispersion liquid is filtered in method (B) may be filter paper or a porous sheet made from cellulose, nitrocellulose, alumina, or the like.

=Application=

Application of the fibrous carbon nanostructure dispersion liquid onto the film formation substrate in method (A) can be performed by a commonly known application method. Specific examples of application methods that can be used include dipping, roll coating, gravure coating, knife coating, air knife coating, roll knife coating, die coating, screen printing, spray coating, and gravure offset.

=Filtration=

Filtration of the fibrous carbon nanostructure dispersion liquid using the film formation substrate in method (B) can be performed by a commonly known filtration method. Specific examples of filtration methods that can be used include natural filtration, vacuum filtration, pressure filtration, and centrifugal filtration.

=Drying=

Drying of the fibrous carbon nanostructure dispersion liquid applied onto the film formation substrate in method (A) or of the filtration residue obtained in method (B) may be performed by a commonly known drying method. Examples of drying methods that can be used include hot-air drying, vacuum drying, hot-roll drying, and infrared irradiation. Although no specific limitations are placed on the drying temperature and time, the drying temperature is normally from room temperature to 200° C. and the drying time is normally from 0.1 minutes to 150 minutes.

——After Treatment of Porous Film——

The porous film formed as set forth above normally contains components that were contained in the fibrous carbon nanostructure dispersion liquid, such as single-walled CNTs, fibrous carbon nanostructures other than single-walled CNTs, and a dispersant, in the same ratio as in the fibrous carbon nanostructure dispersion liquid. In the production method of the porous film, the porous film that is formed in the film formation step may optionally be washed so as to remove the dispersant from the porous film. Characteristics of the porous film such as electrical conductivity can be further enhanced by removing the dispersant from the porous film.

Washing of the porous film can be performed by bringing the porous film into contact with a solvent in which the dispersant is soluble so that the dispersant in the porous film elutes into the solvent. The solvent in which the dispersant in the porous film is soluble is not specifically limited and may be any of the previously described solvents that can be used as the solvent of the fibrous carbon nanostructure dispersion liquid. Note that it is preferable to use the same solvent as the solvent of the fibrous carbon nanostructure dispersion liquid. Contacting of the porous film and the solvent can be performed by immersing the porous film in the solvent or by applying the solvent onto the porous film. The washed porous film can then be dried by a known method.

In production of the porous film, the porous film that is formed in the film formation step may optionally be subjected to pressing so as to further increase the density thereof, for example, and adjust voids as necessary. However, from a viewpoint of suppressing deterioration of characteristics due to damage or destruction of the single-walled CNTs, it is preferable that the pressing pressure is less than 3 MPa in a case in which pressing is performed, and more preferable that pressing is not performed.

<First Conductive Adhesive Layer 9>

The first conductive adhesive layer 9 is a layer that has electrical conductivity and that has a function of adhering the second charge transport layer 7 and the current-collecting electrode 11.

Supposing a case in which a first conductive adhesive layer is not present between the second charge transport layer 7 and the current-collecting electrode 11 and in which the second charge transport layer 7 and the current-collecting electrode 11 are directly in contact in the photoelectric conversion element module 1, the inclusion of a carbon material in the second charge transport layer as previously described means that irregularities are present at the surface thereof, and thus there is insufficient contact between the second charge transport layer 7 and the current-collecting electrode 11 and unstable electrical connection, thereby resulting in reduction of photoelectric conversion efficiency of the photoelectric conversion element module 1.

In contrast, the inclusion of the first conductive adhesive layer 9 between the second charge transport layer 7 and the current-collecting electrode 11 in the photoelectric conversion element module 1 makes it possible to stabilize electrical connection of the second charge transport layer 7 and the current-collecting electrode 11, and to thereby improve photoelectric conversion efficiency of the photoelectric conversion element module 1.

The first conductive adhesive layer 9 can be formed by, for example, applying a conductive adhesive composition A containing an adhesive material and first conductive fine particles 8 at a specific position to form a coating film, and then performing treatment such as photoirradiation, heating, resting, or the like to cause curing of the adhesive material. The first conductive adhesive layer 9 that is formed contains the first conductive fine particles 8 and a cured product of the adhesive material.

The adhesive material is not specifically limited so long as it is a material that can be cured by any method. For example, a photocurable resin such as an acrylic resin; a thermosetting resin; or a two-component mixed reaction-type adhesive formed of a main ingredient and a curing agent can be used.

<<First Conductive Fine Particles 8>>

The first conductive fine particles 8 contained in the first conductive adhesive layer 9 are a material responsible for electrically connecting the second charge transport layer 7 and the current-collecting electrode 11.

It is preferable that each particle among the first conductive fine particles 8 is in contact with both the second charge transport layer 7 and the current-collecting electrode 11. Through each particle among the first conductive fine particles 8 being in contact with both the second charge transport layer 7 and the current-collecting electrode 11, photoelectric conversion efficiency of the photoelectric conversion element module 1 can be further increased because electrical connection can be further stabilized.

However, note that in the photoelectric conversion element module 1, a first conductive fine particle 8 that is only in contact with one of the second charge transport layer 7 and the current-collecting electrode 11 may be present, and a first conductive fine particle 8 that is not in contact with either of the second charge transport layer 7 and the current-collecting electrode 11 may be present to the extent that the desired effects are obtained.

Although not illustrated in FIG. 1, it is preferable that the first conductive fine particles 8 are at least partially embedded in the second charge transport layer 7 because the second charge transport layer 7 is formed of a porous film containing a carbon material and is flexible. When the first conductive fine particles 8 are at least partially embedded in the second charge transport layer 7, photoelectric conversion efficiency of the photoelectric conversion element module 1 can be further increased because electrical connection can be further stabilized. Note that in a case in which the first conductive fine particles 8 are at least partially embedded in the second charge transport layer 7, one part of a particle among the first conductive fine particles 8 may be present inside the second charge transport layer 7 and another part of the particle may be present outside of the second charge transport layer, or the entirety of a particle among the first conductive fine particles 8 may have completely infiltrated to inside of the second charge transport layer 7. Also note that a state in which the first conductive fine particles 8 are at least partially embedded in the second charge transport layer 7 can be confirmed through scanning electron microscope observation of a cross-section of the photoelectric conversion element module 1, for example.

Examples of the first conductive fine particles 8 include, but are not specifically limited to, particles of metals such as Ag, Au, Cu, Al, In, Sn, Bi, and Pb and oxides thereof; conductive carbon particles such as carbon black; and particles in which the surfaces of organic compound particles such as resin particles or inorganic compound particles are coated by a conductive substance such as a metal (Ag, Au, Cu, etc.) or an oxide thereof, examples of which include Au/Ni alloy-coated particles.

Since resin particles that are coated by a metal have a possibility of corrosion occurring and thus may lead to problems in terms of durability as previously described, it is preferable to use particles containing either or both of a carbon material and a metal oxide as the first conductive fine particles 8 from a viewpoint of inhibiting corrosion due to iodide ions of a perovskite compound contained in the power-generating layer 6 and further increasing durability of the photoelectric conversion element module 1.

The average particle diameter of the first conductive fine particles 8 is preferably 20 nm or more, more preferably 30 nm or more, even more preferably 50 nm or more, further preferably 100 nm or more, and even further preferably 120 nm or more, and is preferably 2,000 nm or less, more preferably 1,000 nm or less, and even more preferably 500 nm or less. When the average particle diameter of the first conductive fine particles 8 is not less than any of the lower limits set forth above, photoelectric conversion efficiency of the photoelectric conversion element module 1 can be further increased because electrical connection can be further stabilized through good contact of the first conductive fine particles 8 with the second charge transport layer 7 and the current-collecting electrode 11. On the other hand, when the average particle diameter of the first conductive fine particles 8 is not more than any of the upper limits set forth above, excessive squashing of the second charge transport layer 7 (porous film) by the first conductive fine particles 8 can be prevented, and characteristics of the photoelectric conversion element module 1 can be maintained well.

Note that the average particle diameter of the first conductive fine particles 8 is preferably larger than surface roughness Rz of the second charge transport layer 7.

The proportional content of the first conductive fine particles 8 in the first conductive adhesive layer 9 is preferably 6 mass % or more, more preferably 8 mass % or more, and even more preferably 10 mass % or more, and is preferably 30 mass % or less, more preferably 25 mass % or less, and even more preferably 20 mass % or less. When the proportional content of the first conductive fine particles 8 in the first conductive adhesive layer 9 is not less than any of the lower limits set forth above, electrical connection of the second charge transport layer 7 and the current-collecting electrode 11 via the first conductive fine particles is further stabilized, and photoelectric conversion efficiency of the photoelectric conversion element module 1 can be further increased. On the other hand, when the proportional content of the first conductive fine particles 8 in the first conductive adhesive layer 9 is not more than any of the upper limits set forth above, electrical connection is further stabilized through good adhesion of the second charge transport layer 7 and the current-collecting electrode 11, and photoelectric conversion efficiency of the photoelectric conversion element module 1 can be further increased.

<Current-Collecting Electrode 11>

The current-collecting electrode 11 is a conductive film that is formed on the base plate 12. By providing the current-collecting electrode 11, it is possible to impart electrical conductivity to the surface of the base plate 12. The conductive film forming the current-collecting electrode 11 is not specifically limited so long as it is a film having electrical conductivity such as a metal film or a film formed of a metal oxide. However, a film formed of a metal oxide is preferable from a viewpoint of facilitating patterning by laser scribing or the like.

Examples of metal oxides that may form the current-collecting electrode 11 include the same metal oxides as previously described as examples of metal oxides that may form the transparent conductive film 4.

The thickness of the current-collecting electrode 11 is not specifically limited so long as it is a thickness that enables the desired electrical conductivity to be imparted to the base plate 12 and can be set as not less than 1 nm and not more than 1 μm, for example.

<Base Plate 12>

The base plate 12 may be a base plate formed of glass or a synthetic resin, a film formed of a synthetic resin, or the like, for example, without any specific limitations. Note that examples of glasses and synthetic resins that may be used include the glasses and synthetic resins that were previously described as materials that may form the light-transmitting base plate 3.

The thickness of the base plate 12 is not specifically limited and may be any thickness that makes it possible to maintain the shape thereof as a base plate. For example, the thickness of the base plate 12 can be set as not less than 0.1 mm and not more than 10 mm.

<Second Conductive Adhesive Layer 14>

The second conductive adhesive layer 14 has electrical conductivity. The second conductive adhesive layer 14 is formed between two photoelectric conversion elements 15 that are adjacent to each other on the light-transmitting base plate 3. The second conductive adhesive layer 14 adheres a current-collecting electrode 11 disposed at a side corresponding to one photoelectric conversion element 15 (left side in FIG. 1) at a section of the current-collecting electrode 11 that extends to a side corresponding to the other photoelectric conversion element 15 (right side in FIG. 1) and also adheres a transparent conductive film 4 of the other photoelectric conversion element 15 at a section of the transparent conductive film 4 that extends to the side corresponding to the one photoelectric conversion element 15. Consequently, the current-collecting electrode 11 disposed at the side corresponding to the one photoelectric conversion element 15 and the transparent conductive film 4 of the other photoelectric conversion element 15 are electrically connected via the second conductive adhesive layer 14. This makes it possible to electrically connect the two photoelectric conversion elements 15 that are adjacent to each other on the base plate 3 while also maintaining good transparency of a space between the two adjacent photoelectric conversion elements 15. Note that in a case in which two adjacent photoelectric conversion elements 15 are connected via the second conductive adhesive layer 14 in this manner, the space between the two adjacent photoelectric conversion elements 15 can be narrowed because it is not necessary to provide a partition formed of an electrical insulator or the like between the two adjacent photoelectric conversion elements 15, and thus the number of photoelectric conversion elements per unit area can be increased, thereby enabling a high degree of integration of the photoelectric conversion element module 1.

The second conductive adhesive layer 14 can be formed by, for example, applying a conductive adhesive composition B containing an adhesive material and second conductive fine particles 13 at a specific position to form a coating film, and then performing treatment such as photoirradiation, heating, resting, or the like to cause curing of the adhesive material. The second conductive adhesive layer 14 that is formed contains the second conductive fine particles 13 and a cured product of the adhesive material.

The adhesive material is not specifically limited so long as it is a material that can be cured by any method. For example, a photocurable resin such as an acrylic resin; a thermosetting resin; or a two-component mixed reaction-type adhesive formed of a main ingredient and a curing agent can be used.

<<Second Conductive Fine Particles 13>>

The second conductive fine particles 13 contained in the second conductive adhesive layer 14 are a material responsible for electrically connecting the current-collecting electrode 11 disposed at the side corresponding to the one photoelectric conversion element 15 and the transparent conductive film 4 of the other photoelectric conversion element 15.

The second conductive fine particles 13 are preferably in contact with both the current-collecting electrode 11 disposed at the side corresponding to the one photoelectric conversion element 15 and the transparent conductive film 4 of the other photoelectric conversion element 15. Through the second conductive fine particles 13 being in contact with both the current-collecting electrode 11 disposed at the side corresponding to the one photoelectric conversion element 15 and the transparent conductive film 4 of the other photoelectric conversion element 15, photoelectric conversion efficiency of the photoelectric conversion element module 1 can be further increased because electrical connection can be further stabilized.

However, it should be noted that in the photoelectric conversion element module 1, a second conductive fine particle 13 that is only in contact with one of the one current-collecting electrode 11 and the transparent conductive film 4 of the other photoelectric conversion element 15 may be present, and a second conductive fine particle 13 that is not in contact with either of the one current-collecting electrode 11 and the transparent conductive film 4 of the other photoelectric conversion element 15 may be present to the extent that the desired effects are obtained. Moreover, an electrical conduction path may be formed from the one current-collecting electrode 11 to the transparent conductive film 4 of the other photoelectric conversion element 15 through a plurality of second conductive fine particles 13 being arranged in a row such that a second conductive fine particle 13 that is arranged at one end is in contact with the one current-collecting electrode 11 and a second conductive fine particle 13 that is arranged at the other end is in contact with the transparent conductive film 4 of the other photoelectric conversion element 15.

Examples of the second conductive fine particles 13 include, but are not specifically limited to, particles of metals such as Ag, Au, Cu, Al, In, Sn, Bi, and Pb and oxides thereof; conductive carbon particles such as carbon black; and particles in which the surfaces of organic compound particles such as resin particles or inorganic compound particles are coated by a conductive substance such as a metal (Ag, Au, Cu, etc.) or an oxide thereof, examples of which include Au/Ni alloy-coated particles.

A representative shape of the second conductive fine particles 13 is preferably a spherical shape such as an oblate spheroidal shape or a perfectly spherical shape. In particular, a perfectly spherical shape or an oblate spheroidal shape that is as close as possible to a perfect sphere is preferable. Through a representative shape of the second conductive fine particles 13 being a perfectly spherical shape or an oblate spheroidal shape that is as close as possible to a perfect sphere, production efficiency of the photoelectric conversion element module 1 can be increased.

A maximum dimension R of the second conductive fine particles 13 can, for example, be set as not less than 10 μm and not more than 30 μm.

Note that the maximum dimension R of the second conductive fine particles 13 is a value calculated as the number-average value of major axis length values obtained through microscope observation of 100 particles among the second conductive fine particles 13.

The average particle diameter of the second conductive fine particles 13 is preferably larger than the average particle diameter of the first conductive fine particles 8. When the average particle diameter of the second conductive fine particles 13 is larger than the average particle diameter of the first conductive fine particles 8, this makes it easier for the first conductive fine particles 8 to be in contact with both the second charge transport layer 7 and the current-collecting electrode 11 and for the second conductive fine particles 13 to be in contact with both the current-collecting electrode 11 and the transparent conductive film 4 as previously described, which can thereby further stabilize electrical connection and further increase photoelectric conversion efficiency of the photoelectric conversion element module 1.

The first charge transport layer 5, the power-generating layer 6, the porous film used for the second charge transport layer 7, the first conductive fine particles 8, and the second conductive fine particles 13 preferably satisfy a relationship expressed by the following formula (I).

$$\text{(Thickness of first charge transport layer 5)} + \text{(Thickness of power-generating layer 6)} + \text{(Thickness of porous film used as second charge transport layer 7)} + \text{(Average particle diameter of first conductive fine particles 8)} > \text{(Average particle diameter of second conductive fine particles 13)} \quad \text{(I)}$$

Note that "Thickness of porous film used as second charge transport layer 7" in the preceding formula (I) means the thickness of the porous film in a state in which it is not pressed in the thickness direction.

In a case in which the first charge transport layer 5, the power-generating layer 6, the porous film used for the second charge transport layer 7, the first conductive fine particles 8, and the second conductive fine particles 13 satisfy the relationship expressed by the preceding formula (I), it is possible for the first conductive fine particles 8 to be brought into contact with both the second charge transport layer 7 and the current-collecting electrode 11 and for the second conductive fine particles 13 to be brought into contact with both the current-collecting electrode 11 and the transparent conductive film 4 through deformation and a suitable degree of squashing of the porous film when the light-transmitting base plate 3 having the plurality of photoelectric conversion elements 15, etc., formed thereon and the current-collecting electrode base plate 10 are affixed so as to produce the photoelectric conversion element module 1, and thus electrical connection can be further stabilized, and photoelectric conversion efficiency of the photoelectric conversion element module 1 can be further increased.

Note that in a case in which an auxiliary electrode that can electrically connect to at least one thickness direction side of the second conductive adhesive layer 14 is formed, it is preferable that the first charge transport layer 5, the power-generating layer 6, the porous film used for the second charge transport layer 7, the first conductive fine particles 8, the second conductive fine particles 13, and the auxiliary electrode satisfy a relationship expressed by the following formula (II) instead of the preceding formula (I).

(Thickness of first charge transport layer 5)+(Thickness of power-generating layer 6)+(Thickness of porous film used as second charge transport layer 7)+(Average particle diameter of first conductive fine particles 8)>(Average particle diameter of second conductive fine particles 13)+(Thickness of auxiliary electrode) (II)

Note that "Thickness of porous film used as second charge transport layer 7" in the preceding formula (II) means the thickness of the porous film in a state in which it is not pressed in the thickness direction. Moreover, "Thickness of auxiliary electrode" in formula (II) means the total auxiliary electrode thickness. For example, in a case in which auxiliary electrodes are formed at both thickness direction sides of the second conductive adhesive layer 14, "Thickness of auxiliary electrode" in formula (II) means the total thickness of the auxiliary electrodes formed at both thickness direction sides of the second conductive adhesive layer 14.

The average particle diameter of the second conductive fine particles 13 is preferably 10 μm or more, more preferably 15 μm or more, and even more preferably 20 μm or more, and is preferably 200 μm or less, more preferably 150 μm or less, and even more preferably 80 μm or less. When the average particle diameter of the second conductive fine particles 13 is not less than any of the lower limits set forth above, electrical connection can be further stabilized, and photoelectric conversion efficiency of the photoelectric conversion element module 1 can be further increased because the second conductive fine particles 13 can easily be caused to be in contact with the current-collecting electrode 11 and the transparent conductive film 4. On the other hand, when the average particle diameter of the second conductive fine particles 13 is not more than any of the upper limits set forth above, electrical connection can be further stabilized, and photoelectric conversion efficiency of the photoelectric conversion element module 1 can be further increased because the relationship expressed by formula (I) or (II) can easily be satisfied.

The photoelectric conversion element module 1 set forth above has high photoelectric conversion efficiency and excellent durability. Note that so long as the presently disclosed photoelectric conversion element module includes a plurality of photoelectric conversion elements that each include a transparent conductive film, a first charge transport layer, a power-generating layer, and a second charge transport layer formed of a porous film containing a carbon material stacked in this order on a light-transmitting base plate and so long as among two adjacent photoelectric conversion elements, the second charge transport layer of one photoelectric conversion element and the transparent conductive film of the other photoelectric conversion element are electrically connected via a first conductive adhesive layer, a current-collecting electrode, and a second conductive adhesive layer, the presently disclosed photoelectric conversion element module may further include other members besides the constituent members set forth above to the extent that the desired effects are obtained.

(Method of Producing Photoelectric Conversion Element Module)

Next, the presently disclosed method of producing a photoelectric conversion element module is described, referring once again to FIG. 1. The presently disclosed method of producing a photoelectric conversion element module is required to include a connection step of connecting two adjacent photoelectric conversion elements among a plurality of photoelectric conversion elements formed on a light-transmitting base plate and optionally includes steps other than the connection step. The following provides a specific description of a method of producing the photoelectric conversion element module 1 as one example of the presently disclosed method of producing a photoelectric conversion element module.

<Preparation of Light-Transmitting Base Plate 3>

In the production method of the photoelectric conversion element module 1, first a light-transmitting base plate 3 is prepared. The light-transmitting base plate 3 can be any of those given as examples in the "Photoelectric conversion element module" section.

<Formation of Transparent Conductive Film 4>

Next, a transparent conductive film 4 is formed on the light-transmitting base plate 3. A commonly known method such as sputtering or vapor deposition can be adopted as the formation method of the transparent conductive film 4 without any specific limitations. Note that formation of the transparent conductive film 4 may be omitted by using a commercially available light-transmitting base plate that has a transparent conductive film formed on the surface thereof.

In order to form photoelectric conversion elements 15 in a desired number and arrangement in the produced photoelectric conversion element module 1, a plurality of transparent conductive films 4 are formed in a desired pattern on the light-transmitting base plate 3. For example, a transparent conductive film 4 formed over the entire surface of the light-transmitting base plate 3 may be subjected to etching or the like in order to partially remove the transparent conductive film and thereby obtain a plurality of transparent conductive films 4 formed in a desired pattern.

<Formation of First Charge Transport Layer 5>

A first charge transport layer 5 is then formed on the transparent conductive film 4. The first charge transport layer 5 may be obtained by, for example, forming a base layer on the transparent conductive film 4 and then forming a porous semiconductor layer.

{Formation of Base Layer}

No specific limitations are placed on the method by which the base layer is formed. For example, the base layer can be formed by spraying a solution containing a material that forms an n-type semiconductor against the transparent conductive film 4.

The method by which the solution is sprayed may be spray pyrolysis, aerosol deposition, electrostatic spraying, cold spraying, or the like, for example.

{Formation of Porous Semiconductor Layer}

No specific limitations are placed on the method by which the porous semiconductor layer is formed. For example, the porous semiconductor layer can be formed by applying a solution containing a precursor of an n-type semiconductor onto the base layer by spin coating or the like and then drying the solution.

The n-type semiconductor precursor may be titanium tetrachloride ($TiCl_4$), peroxo titanic acid (PTA), a titanium alkoxide such as titanium ethoxide or titanium isopropoxide (TTIP), or a metal alkoxide such as zinc alkoxide, alkoxysilane, zirconium alkoxide, or titanium diisopropoxide bis(acetylacetonate).

The solvent used in the solution containing the n-type semiconductor precursor is not specifically limited and can, for example, be an alcohol solution of ethanol or the like.

Moreover, the temperature and duration of drying of the applied solution on the base layer are not specifically limited and may be adjusted as appropriate depending on the type of n-type precursor and the type of solvent that are used, for example.

<Formation of Power-Generating Layer 6>

Next, a power-generating layer 6 is formed on the first charge transport layer 5. The formation method of the power-generating layer 6 may be vacuum vapor deposition, application, or the like without any specific limitations. For example, the power-generating layer 6 can be formed by applying a precursor-containing solution that contains a precursor of a perovskite compound onto the first charge transport layer 5 and then performing firing thereof. The perovskite compound precursor may be lead iodide ($PbI_2$), methylammonium iodide ($CH_3NH_3I$), or the like, for example. The solvent contained in the precursor-containing solution is not specifically limited and can, for example, be N,N-dimethylformamide, dimethyl sulfoxide, or the like. After application of such a solution, precipitation of a perovskite compound can be promoted using a poor solvent.

Note that the term "poor solvent" as used in the present specification refers to a solvent in which the perovskite compound is not substantially changed in a production step. The perovskite compound can be said to be substantially unchanged in a production step when no change in external appearance such as film clouding is observed upon visual inspection.

The concentration of the perovskite compound precursor in the precursor-containing solution may be a concentration that is appropriate depending on the solubility of a material forming the perovskite compound, for example, and can be set as approximately 0.5 M to 1.5 M, for example.

A commonly known application method such as a spin coating, spraying, bar coating, or inkjet method can be adopted as the method by which the precursor-containing solution is applied onto the first charge transport layer 5 without any specific limitations.

<Formation of Second Charge Transport Layer 7>

After formation of the power-generating layer 6, a second charge transport layer 7 is formed on the power-generating layer 6. Note that the second charge transport layer 7 may be formed on the power-generating layer 6 with a joining layer in-between as necessary. For example, a porous film containing a carbon material may be stacked on the power-generating layer 6 in a state in which a joining surface of at least one of the power-generating layer 6 and the porous film retains a solvent X or a solution P. This enables simple production of a photoelectric conversion element module 1 having high photoelectric conversion efficiency.

Note that the porous film can be the porous film containing a carbon material that was previously described in the "Photoelectric conversion element module" section.

The solvent X may be a poor solvent such as chlorobenzene, toluene, or anisole, for example. By using any of these poor solvents, it is possible to cause good affixing of the porous film containing a carbon material to the power-generating layer 6 in a case in which the power-generating layer 6 is a perovskite layer formed of a perovskite compound, for example.

Moreover, in a case in which the second charge transport layer 7 is formed on the power-generating layer 6 with a joining layer in-between, a solution P is used instead of the solvent X described above.

The solution P may, for example, be an organic material-containing solution that has an organic material A forming the joining layer such as previously described dissolved in a poor solvent.

Good retention of the solvent X or the solution P at a joining surface of at least one of the power-generating layer 6 and the porous film can be achieved by using a porous film that is impregnated with the solvent X or the solution P described above.

A porous film that is impregnated with the solvent X or the solution P may be obtained by, for example, immersing the porous film in the solvent X or the solution P described above and then pulling up the porous film. The immersion time during this operation is not specifically limited and may be set as appropriate depending on the type of solvent or solution that is used, for example.

Although no specific limitations are placed on the method by which the joining layer is formed, it is preferable from a viewpoint of efficiently producing the photoelectric conversion element module 1 that the porous film is immersed in an organic material-containing solution having the organic material A (for example, PMMA or the like such as previously described) forming the joining layer dissolved in a poor solvent, is pulled up from the organic material-containing solution, and is subsequently heated and dried so as to form a joining layer on the porous film, and that this porous film is then affixed to the power-generating layer 6 with the joining layer interposed therebetween. The immersion time, heating temperature, and drying time during these operations are not specifically limited and may be set as appropriate depending on the type of organic material-containing solution that is used, for example. The solvent in which the organic material A forming the joining layer is dissolved is preferably a poor solvent in order to prevent effects due to the solvent remaining. However, various solvents can be used as the solvent without limitation to poor solvents so long as the solvent can be dried without causing a change of the power-generating layer 6.

The porous film that has been stacked on the power-generating layer 6 is preferably heat pressed. This makes it possible to form a photoelectric conversion element 15 having excellent unity. The heating temperature in this heat pressing is not specifically limited and can be set as approximately 100° C., for example. Moreover, the pressure during heat pressing is not specifically limited and can be set as 0.05 MPa, for example. The pressing time is also not specifically limited and can be set as 30 seconds, for example. In order to promote removal of a solvent contained in the porous film during heat pressing, it is preferable that pressing is performed in a form that ensures a volatilization pathway for the solvent. Specifically, it is preferable that the heat pressing is performed through a member including voids such as a thick wipe, a porous rubber, a porous metal, or a porous ceramic, for example, in order to ensure a volatilization pathway for the solvent.

Through the operations described above, a plurality of photoelectric elements 15 are formed on the light-transmitting base plate. Note that the photoelectric conversion elements 15 each include a transparent conductive film 4, a first charge transport layer 5, a power-generating layer 6, and a second charge transport layer 7 stacked in order from a side corresponding to the light-transmitting base plate 3, and the second charge transport layer is formed of a porous film that contains a carbon material.

<Connection of Photoelectric Conversion Elements 15>

Among the plurality of photoelectric conversion elements 15 formed on the light-transmitting base plate 3, two photoelectric conversion elements 15 that are adjacent to each other are connected.

First, a conductive adhesive composition A used to form a first conductive adhesive layer 9 and a conductive adhesive composition B used to form a second conductive adhesive layer 14, which were previously described, are each applied at a specific position on the light-transmitting base plate on which the plurality of photoelectric conversion elements have been formed. Note that application of the conductive adhesive composition A and the conductive adhesive composition B can be performed using a dispensing device or the like, for example.

Next, the light-transmitting base plate 3 on which the plurality of photoelectric conversion elements 15 have been formed and onto which the conductive adhesive compositions A and B have been applied at specific positions is affixed with a current-collecting electrode base plate 10 at a specific position. Note that the current-collecting electrode base plate 10 can be produced by forming a current-collecting electrode 11 on a base plate 12 by the same method as which the transparent conductive film 4 is formed on the light-transmitting base plate 3 described above. The affixing of the light-transmitting base plate 3 and the current-collecting electrode base plate 10 can be performed in a reduced pressure environment using a vacuum affixing device.

Thereafter, a first conductive adhesive layer 9 and a second conductive adhesive layer 14 can be formed through curing of adhesive material contained in the conductive adhesive compositions A and B by performing treatment such as photoirradiation, heating, or resting as necessary.

Through the operations described above, a photoelectric conversion element module 1 that includes a plurality of photoelectric conversion elements 15 on a light-transmitting base plate 3 and in which two adjacent photoelectric conversion elements 15 are electrically connected is obtained. Among two adjacent photoelectric conversion elements 15 in this photoelectric conversion element module 1, the second charge transport layer 7 of one photoelectric conversion element 15 is connected to a current-collecting electrode 11 via a first conductive adhesive layer 9. Note that this current-collecting electrode 11 extends to a side corresponding to the other photoelectric conversion element 15. Moreover, the transparent conductive film 4 of the other photoelectric conversion element 15 extends to a side corresponding to the one photoelectric conversion element 15. The section of the current-collecting electrode 11 that extends to the side corresponding to the other photoelectric conversion element 15 is connected, via a second conductive adhesive layer 14, to the section of the transparent conductive film 4 of the other photoelectric conversion element 15 that extends to the side corresponding to the one photoelectric conversion element 15. In this manner, among two photoelectric conversion elements 15 that are adjacent to each other, the second charge transport layer 7 of one photoelectric conversion element 15 and the transparent conductive film 4 of the other photoelectric conversion element 15 are electrically connected via a first conductive adhesive layer 9, a current-collecting electrode 11, and a second conductive adhesive layer 14.

Through the production method set forth above, it is possible to efficiently produce the photoelectric conversion element module 1 illustrated in FIG. 1. Note that the presently disclosed method of producing a photoelectric conversion element module is not limited to the method set forth above and may further include other steps besides the steps described above to the extent that the desired effects are obtained.

EXAMPLES

The following provides a more specific description of the present disclosure based on examples. However, the present disclosure is not limited to the following examples.

Note that although each photoelectric conversion element module produced in the examples and comparative examples was a module in which two photoelectric conversion elements were connected in series (i.e., a two-series module), the number of photoelectric conversion elements in series can be selected as appropriate depending on the application.

The following methods were used to measure the thickness and thickness reduction upon thickness direction pressing of a porous film produced in each example or comparative example, and the cell performance and performance retention rate of a photoelectric conversion element module.

<Thickness and Thickness Reduction Upon Thickness Direction Pressing of Porous Film>

The thickness of a CNT film serving as a porous film containing a carbon material in a state in which the CNT film was not pressed in the thickness direction was measured using a thickness gauge in a state in which the CNT film was sandwiched between two glass base plates.

In addition, the thickness of the CNT film serving as a porous film containing a carbon material in a state in which the CNT film was pressed with a pressure of 0.05 Pa in the thickness direction using a pressing machine at a temperature of 25° C. was measured by the same method as described above, and the thickness reduction upon thickness direction pressing at 0.05 Pa was determined from the difference compared to the thickness in a state in which the CNT film was not pressed in the thickness direction.

<Cell Performance>

A solar simulator (PEC-L11 produced by Peccell Technologies Inc.) in which an AM1.5G filter was attached to a 150 W xenon lamp light source was used as a light source. The light source was adjusted to 1 sun (AM1.5G, 100 mW/cm$^2$ [Class A of JIS C8912]).

A photoelectric conversion element module produced in each example or comparative example was connected to a source measure unit (Series 2400 SourceMeter produced by Keithley Instruments), and the following current/voltage characteristic was measured.

Output current was measured while changing bias voltage from −0.2 V to 2.0 V in 0.02 V units under 1 sun photoirradiation. The output current was measured for each voltage step by, after the voltage had been changed, integrating values from 0.1 seconds after the voltage change to 0.2 seconds after the voltage change.

The short-circuit current density (mA/cm$^2$), open-circuit voltage (V), fill factor, and photoelectric conversion efficiency (%) were calculated from the measurement results of the current/voltage characteristic described above.

<Performance Retention Rate>

A photoelectric conversion element module produced in each example or comparative example was used to evaluate initial cell performance by the method described above. Next, the photoelectric conversion element module was loaded into a reliability test tank (IH constant temperature and constant humidity vessel produced by Yamato Scientific Co., Ltd.) that was maintained at a temperature of 45° C. and a humidity of 90% RH, and a reliability test was performed by leaving the photoelectric conversion element module for 1,000 hours in a light-shielded state without passing of current. The photoelectric conversion element module that had undergone the reliability test was used to evaluate cell performance by the method described above.

A performance retention rate (%) was calculated by the following formula using the conversion efficiency E1(%) measured in evaluation of initial cell performance of the photoelectric conversion element module and the conversion efficiency E2(%) measured in evaluation of post-reliability test cell performance.

Performance retention rate (%)=(E2/E1)×100

A larger value for the performance retention rate indicates that the photoelectric conversion element module has better durability.

Example 1

<Production of Light-Transmitting Base Plate with Transparent Conductive Film>

A conductive glass base plate (produced by Sigma-Aldrich; thickness: 2.2 mm) that included a fluorine-doped tin oxide (FTO) film (thickness: 600 nm) formed as a transparent conductive film on the surface of a glass base plate was used, and the FTO film was partially removed by etching. In this manner, a light-transmitting base plate having a transparent conductive film (FTO film) formed in a two-series module pattern (hereinafter, also referred to as a "transparent conductive base plate") was obtained.

<Formation of First Charge Transport Layer>

A solution (produced by Sigma-Aldrich) of titanium diisopropoxide bis(acetylacetonate) dissolved in isopropanol was sprayed onto the surface of the transparent conductive film (FTO film) of the transparent conductive base plate by spray pyrolysis. During this spraying, a strip-shaped glass sheet was set up so as to form a base layer at a specific location. In this manner, a base layer formed of titanium dioxide ($TiO_2$ dense layer; thickness: 30 nm) was formed on a section of the transparent conductive film (FTO film) formed in a two-series module pattern other than a section thereof that comes into contact with a subsequently described second conductive adhesive layer. Next, a solution of titanium oxide paste (produced by Sigma-Aldrich) diluted with ethanol was prepared, the obtained solution was applied onto the surface of the base layer by spin coating, 10 minutes of drying was performed on a hot plate at 120° C., coating film extending beyond the base layer in plan view was wiped off, and then 30 minutes of heat treatment was performed at a temperature of 450° C. so as to form a porous semiconductor layer formed of titanium dioxide ($TiO_2$) ($TiO_2$ porous layer; thickness: 120 nm; average particle diameter of $TiO_2$ fine particles: 20 nm), and thereby obtain a first charge transport layer.

<Formation of Power-Generating Layer>

An N,N-dimethylformamide (DMF) solution containing lead iodide ($PbI_2$) with a concentration of 1.0 M and methylammonium iodide ($CH_3NH_3I$) with a concentration of 1.0 M was prepared as a solution (1) containing a precursor of a perovskite compound. The obtained solution (1) was applied onto the surface of the first charge transport layer by spin coating while dripping chlorobenzene onto the surface and was then subjected to 10 minutes of firing at a temperature of 100° C. to form a perovskite layer (thickness: 450 nm) as a power-generating layer. Thereafter, perovskite layer extending beyond the surface of the first charge transport layer in plan view was removed so as to obtain a power-generating layer-equipped base plate having a power-generating layer formed in a two-series module pattern.

<Production of Porous Film (CNT Film) Containing Carbon Material>

A porous film (CNT film) containing single-walled CNTs as a carbon material was produced by the following procedure.

A crude dispersion liquid containing sodium deoxycholate (DOC) as a dispersant was obtained by adding 1.0 g of carbon nanotubes (produced by Zeon Corporation; product name: ZEONANO SG101; single-walled CNTs (SGCNTs); average diameter: 3.5 nm; G/D ratio: 2.1; convex upward t-plot without opening formation treatment) as fibrous carbon nanostructures including single-walled CNTs to 500 mL of a 2 mass % aqueous solution of DOC serving as a dispersant-containing solvent. This crude dispersion liquid was loaded into a high-pressure homogenizer (produced by Beryu Corp.; product name: BERYU SYSTEM PRO) including a multistage pressure controller (multistage pressure reducer) for applying back pressure during dispersing and was subjected to dispersing treatment at a pressure of 100 MPa. Specifically, back pressure was applied while imparting shear force to the crude dispersion liquid so as to disperse the fibrous carbon nanostructures including single-walled CNTs and thereby obtain a fibrous carbon nanostructure dispersion liquid containing single-walled CNTs. Note that the dispersing treatment was performed for 10 minutes while causing dispersion liquid flowing out from the high-pressure homogenizer to return into the high-pressure homogenizer.

A 200 mL beaker was charged with 50 g of the produced fibrous carbon nanostructure dispersion liquid containing single-walled CNTs, and then 50 g of distilled water was added thereto so as to produce a dispersion liquid diluted by a factor of 2. Filtration of the dispersion liquid was performed using a vacuum filtration device equipped with a membrane filter under conditions of 0.09 MPa. Once the filtration was complete, isopropyl alcohol and water were each passed through the vacuum filtration device so as to wash a CNT film that had been formed on the membrane filter, and then air was passed for 15 minutes. Next, the produced CNT film/membrane filter was immersed in ethanol, and the CNT film was peeled from the membrane filter to obtain a CNT film (A) as a porous film containing a carbon material.

The obtained CNT film (A) was of equivalent size to the membrane filter, had excellent film formation properties, and had excellent self-supporting ability such that it maintained the state of a film even after peeling from the filter. The obtained CNT film (A) was determined to have a density of 0.85 g/cm$^3$ as a result of measurement of film density of the CNT film (A) using the weight and the volume determined from the thickness according to a stylus profilometer. Upon measurement by the previously described method, the CNT film (A) serving as a porous film containing a carbon material had a thickness of 20 µm in a state in which the CNT film (A) was not pressed in the thickness direction and had a thickness reduction of 2 µm upon thickness direction pressing at 0.05 Pa.

<Formation of Second Charge Transport Layer>

The CNT film (A) was cut to a specific size, was immersed in chlorobenzene for 10 seconds, and was subsequently pulled up from the chlorobenzene so as to obtain a CNT film (1) impregnated with chlorobenzene. The CNT film (1) was stacked on the power-generating layer-equipped base plate described above while the power-generating layer-equipped base plate was being heated on a hot plate having a temperature of 100° C., and then pressing (heat pressing) was performed with a pressure of 0.05 Pa in the thickness direction from the CNT film (1) side of the resultant laminate so as to form a second charge transport layer. In this manner, two adjacent photoelectric conversion elements were formed on the light-transmitting base plate.

<Production of Photoelectric Conversion Element Module>

Carbon black (average particle diameter: 120 nm) as first conductive fine particles was added to TB3035B (produced by ThreeBond Co., Ltd.) as an acrylic resin (adhesive material) such that the carbon black was 10 mass %, and uniform mixing thereof was performed by a planetary centrifugal mixer to produce a conductive adhesive composition A used for forming a first conductive adhesive layer.

Next, Micropearl AU produced by Sekisui Chemical Co., Ltd. (conductive fine particles having Au surface coating; representative shape: perfect sphere; maximum dimension: 20 μm; average particle diameter: 20 μm) as second conductive fine particles were added to TB3035B (produced by ThreeBond Co., Ltd.) as an acrylic resin (adhesive material) such that the Micropearl AU was 13.5 mass %, and uniform mixing thereof was performed by a planetary centrifugal mixer to produce a conductive adhesive composition B used for forming a second conductive adhesive layer.

In addition, a current-collecting electrode base plate having a current-collecting electrode formed in a two-series module pattern on a base plate was produced by the same method as in production of the transparent conductive base plate described above.

A dispensing device was used to apply the conductive adhesive composition A and the conductive adhesive composition B at specific positions on the light-transmitting base plate on which the photoelectric conversion elements had been formed, and then a vacuum affixing device was used to affix the current-collecting electrode base plate at a specific position in a reduced pressure environment. Thereafter, photoirradiation was performed using a metal halide lamp so as to form a first conductive adhesive layer containing the first conductive fine particles and a second conductive adhesive layer containing the second conductive fine particles. In this manner, a photoelectric conversion element module in which two adjacent photoelectric conversion elements were connected in series was obtained.

Note that in the obtained photoelectric conversion element module, the second charge transport layer of one photoelectric conversion element among the two adjacent photoelectric conversion elements was connected to the current-collecting electrode via the first conductive adhesive layer. Moreover, a section of the current-collecting electrode that extended to a side corresponding to the other photoelectric conversion element was connected, via the second conductive adhesive layer, to a section of the transparent conductive film of the other photoelectric conversion element that extended to a side corresponding to the one photoelectric conversion element 15. Accordingly, the second charge transport layer of the one photoelectric conversion element and the transparent conductive film of the other photoelectric conversion element were electrically connected via the first conductive adhesive layer, the current-collecting electrode, and the second conductive adhesive layer.

The obtained photoelectric conversion element module was used to measure the cell performance and performance retention rate. The results are shown in Table 1.

Note that upon observation of a cross-section of the obtained photoelectric conversion element module using a scanning electron microscope, the first conductive fine particles 8 were confirmed to be at least partially embedded in the second charge transport layer 7.

Example 2

A photoelectric conversion element module was produced in the same way as in Example 1 with the exception that in production of the photoelectric conversion element module of Example 1, tin-doped indium oxide (ITO) fine particles (average particle diameter: 30 nm) were used instead of carbon black (average particle diameter: 120 nm) as the first conductive fine particles. The obtained photoelectric conversion element module was used to perform measurements in the same way as in Example 1. The results are shown in Table 1.

Example 3

A photoelectric conversion element module was produced in the same way as in Example 1 with the exception that in production of the photoelectric conversion element module of Example 1, a Ti layer was formed as an auxiliary electrode by sputtering using a mask on a section where the second conductive adhesive layer is formed. The obtained photoelectric conversion element module was used to perform measurements in the same way as in Example 1. The results are shown in Table 1.

Comparative Example 1

A photoelectric conversion element module was produced in the same way as in Example 1 with the exception that in production of the photoelectric conversion element module in Example 1, the conductive adhesive composition A was not applied at a specific position on the light-transmitting base plate on which photoelectric conversion elements had been formed. As a consequence, a first conductive adhesive layer was not present, and the second charge transport layer and the current-collecting electrode were directly connected in the photoelectric conversion elements of the obtained photoelectric conversion element module. The obtained photoelectric conversion element module was used to perform measurements in the same way as in Example 1. The results are shown in Table 1.

Comparative Example 2

A photoelectric conversion element module was produced in the same way as in Example 1 with the exception that in formation of the second charge transport layer of Example 1, a composite material film (thickness: 150 nm) produced by a method described below was used instead of the CNT film (A), which was a porous film containing a carbon material, and that in production of the photoelectric conversion element module of Example 1, Micropearl AU produced by Sekisui Chemical Co., Ltd. (conductive fine particles having Au surface coating; representative shape: perfect sphere; maximum dimension: 3 μm; average particle diameter: 3 μm) were used instead of carbon black (average particle diameter: 120 nm) as the first conductive fine particles, and the average particle diameter (maximum diameter) of Micropearl AU produced by Sekisui Chemical Co., Ltd. (conductive fine particles having Au surface coating; representative shape: perfect sphere) that was used as the second conductive fine particles was changed from 20 μm to 4 μm. The obtained photoelectric conversion element module was used to perform measurements in the same way as in Example 1. The results are shown in Table 1.

<Formation of Composite Material Film>

A composite material film was formed by forming a spiro-MeOTAD layer and a Au layer by a method described in non-patent literature (Energy Environ. Sci., 2018, 11, 952-959).

TABLE 1

|  |  |  | Example 1 | Example 2 | Example 3 | Comparative Example 1 | Comparative Example 2 |
|---|---|---|---|---|---|---|---|
| Characteristics | Cell performance | Short-circuit current density [mA/cm$^2$] | 6.67 | 6.54 | 6.63 | 6.21 | 8.75 |
|  |  | Open-circuit voltage [V] | 1.724 | 1.713 | 1.705 | 1.687 | 2.124 |
|  |  | Fill factor | 0.703 | 0.699 | 0.715 | 0.325 | 0.75 |
|  |  | Photoelectric conversion efficiency [%] | 8.08 | 7.83 | 8.08 | 3.40 | 13.94 |
|  | Performance retention rate [%] (after reliability test at 45° C. and 90% RH for 1,000 hours) |  | 105 | 102 | 103 | 98 | 34 |
| Configuration | Transparent conductive base plate | Light-transmitting base plate | Glass | Glass | Glass | Glass | Glass |
|  |  | Transparent conductive film | FTO | FTO | FTO | FTO | FTO |
|  | First charge transport layer | Base layer | TiO$_2$ dense layer (thickness: 30 nm) | TiO$_2$ dense layer (thickness: 30 nm) | TiO$_2$ dense layer (thickness: 30 nm) | TiO$_2$ dense layer (thickness: 30 nm) | TiO$_2$ dense layer (thickness: 30 nm) |
|  |  | Porous semiconductor layer | TiO$_2$ porous layer (thickness: 120 nm) | TiO$_2$ porous layer (thickness: 120 nm) | TiO$_2$ porous layer (thickness: 120 nm) | TiO$_2$ porous layer (thickness: 120 nm) | TiO$_2$ porous layer (thickness: 120 nm) |
|  | Power-generating layer (perovskite layer) |  | MAPbI$_3$ (thickness: 450 nm) | MAPbI$_3$ (thickness: 450 nm) | MAPbI$_3$ (thickness: 450 nm) | MAPbI$_3$ (thickness: 450 nm) | MAPbI$_3$ (thickness: 450 nm) |
|  | Second charge transport layer |  | CNT film (thickness: 20 μm) | CNT film (thickness: 20 μm) | CNT film (thickness: 20 μm) | CNT film (thickness: 20 μm) | Composite material film (Spiro-MeOTAD + Au) |
|  | First conductive adhesive layer |  | Acrylic resin + Carbon black (average particle diameter: 120 nm) | Acrylic resin + ITO fine particles (average particle diameter: 30 nm) | Acrylic resin + Carbon black (average particle diameter: 120 nm) | — | Acrylic resin + Micropearl AU (average particle diameter: 3 μm) |
|  | Current-collecting electrode base plate | Current-collecting electrode | FTO | FTO | FTO | FTO | FTO |
|  |  | Base plate | Glass | Glass | Glass | Glass | Glass |
|  | Second conductive adhesive layer |  | Acrylic resin + Micropearl AU (average particle diameter: 20 μm) | Acrylic resin + Micropearl AU (average particle diameter: 20 μm) | Acrylic resin + Micropearl AU (average particle diameter: 20 μm) + Ti electrode as auxiliary electrode (thickness: 300 nm) | Acrylic resin + Micropearl AU (average particle diameter: 20 μm) | Acrylic resin + Micropearl AU (average particle diameter: 4 μm) |

In Table 1:
"FTO" indicates fluorine-doped tin oxide;
"ITO" indicates tin-doped indium oxide; and
"MAPbI$_3$" indicates CH$_3$NH$_3$PbI$_3$.

It can be seen from Table 1 that in the case of the photoelectric conversion element modules of Examples 1 to 3 that include a plurality of photoelectric conversion elements each including a transparent conductive film, a first charge transport layer, a power-generating layer, and a second charge transport layer formed of a carbon material-containing porous film stacked in this order on a light-transmitting base plate and in which, among two adjacent photoelectric conversion elements, the second charge transport layer of one photoelectric conversion element and the transparent conductive film of the other photoelectric conversion element are electrically connected via a first conductive adhesive layer, a current-collecting electrode, and a second conductive adhesive layer, these photoelectric conversion element modules have high photoelectric conversion efficiency and excellent durability.

In contrast, it can be seen that the photoelectric conversion element module of Comparative Example 1 in which a first conductive adhesive layer is not used has poor photoelectric conversion efficiency.

It can also be seen that the photoelectric conversion element module of Comparative Example 2 in which a material other than a carbon material-containing porous film is used as a second charge transport layer has poor durability.

INDUSTRIAL APPLICABILITY

According to the present disclosure, it is possible to provide a photoelectric conversion element module having high photoelectric conversion efficiency and excellent durability.

REFERENCE SIGNS LIST

1 photoelectric conversion element module
2 transparent conductive base plate
3 light-transmitting base plate
4 transparent conductive film
5 first charge transport layer
6 power-generating layer
7 second charge transport layer
8 first conductive fine particle
9 first conductive adhesive layer
10 current-collecting electrode base plate
11 current-collecting electrode
12 base plate
13 second conductive fine particle
14 second conductive adhesive layer
15 photoelectric conversion element

The invention claimed is:

1. A photoelectric conversion element module comprising a plurality of photoelectric conversion elements formed on a light-transmitting base plate, wherein
the photoelectric conversion elements each include a transparent conductive film, a first charge transport layer, a power-generating layer, and a second charge transport layer stacked in order from a side corresponding to the light-transmitting base plate,
the second charge transport layer is formed of a porous film that contains a carbon material,
among two of the photoelectric conversion elements that are adjacent to each other, the second charge transport layer of one photoelectric conversion element and the transparent conductive film of the other photoelectric conversion element are electrically connected via a first conductive adhesive layer, a current-collecting electrode, and a second conductive adhesive layer,
the first conductive adhesive layer contains first conductive fine particles, and
the first conductive fine particles are at least partially embedded in the second charge transport layer.

2. The photoelectric conversion element module according to claim 1, wherein the carbon material includes one or more carbon nanotubes.

3. The photoelectric conversion element module according to claim 2, wherein the carbon nanotubes include one or more single-walled carbon nanotubes.

4. The photoelectric conversion element module according to claim 1, wherein
the first conductive adhesive layer contains first conductive fine particles, and
the first conductive fine particles contain either or both of a carbon material and a metal oxide.

5. A photoelectric conversion element module comprising a plurality of photoelectric conversion elements formed on a light-transmitting base plate, wherein
the photoelectric conversion elements each include a transparent conductive film, a first charge transport layer, a power-generating layer, and a second charge transport layer stacked in order from a side corresponding to the light-transmitting base plate,
the second charge transport layer is formed of a porous film that contains a carbon material, among two of the photoelectric conversion elements that are adjacent to each other, the second charge transport layer of one photoelectric conversion element and the transparent conductive film of the other photoelectric conversion element are electrically connected via a first conductive adhesive layer, a current-collecting electrode, and a second conductive adhesive layer,
the first conductive adhesive layer contains first conductive fine particles,
the second conductive adhesive layer contains second conductive fine particles, and
the second conductive fine particles have a larger average particle diameter than the first conductive fine particles.

6. The photoelectric conversion element module according to claim 1, wherein the power-generating layer contains a perovskite compound.

7. A method of producing a photoelectric conversion element module comprising a step of connecting two photoelectric conversion elements that are adjacent to each other among a plurality of photoelectric conversion elements formed on a light-transmitting base plate, wherein
the photoelectric conversion elements each include a transparent conductive film, a first charge transport layer, a power-generating layer, and a second charge transport layer stacked in order from a side corresponding to the light-transmitting base plate,
the second charge transport layer is formed of a porous film that contains a carbon material,
among the two photoelectric conversion elements that are adjacent to each other, the second charge transport layer of one photoelectric conversion element and the transparent conductive film of the other photoelectric conversion element are electrically connected via a first conductive adhesive layer, a current-collecting electrode, and a second conductive adhesive layer,
the first conductive adhesive layer contains first conductive fine particles, and
the first conductive fine particles are at least partially embedded in the second charge transport layer.

8. A method of producing a photoelectric conversion element module comprising a step of connecting two photoelectric conversion elements that are adjacent to each other among a plurality of photoelectric conversion elements formed on a light-transmitting base plate, wherein
the photoelectric conversion elements each include a transparent conductive film, a first charge transport layer, a power-generating layer, and a second charge transport layer stacked in order from a side corresponding to the light-transmitting base plate,
the second charge transport layer is formed of a porous film that contains a carbon material,
among the two photoelectric conversion elements that are adjacent to each other, the second charge transport layer of one photoelectric conversion element and the transparent conductive film of the other photoelectric conversion element are electrically connected via a first conductive adhesive layer, a current-collecting electrode, and a second conductive adhesive layer,
the first conductive adhesive layer contains first conductive fine particles,
the second conductive adhesive layer contains second conductive fine particles, and
the second conductive fine particles have a larger average particle diameter than the first conductive fine particles.

* * * * *